(12) United States Patent
Nishimura et al.

(10) Patent No.: US 10,951,211 B2
(45) Date of Patent: Mar. 16, 2021

(54) FPC INTEGRATED CAPACITANCE SWITCH AND METHOD OF MANUFACTURING THE SAME

(71) Applicant: Nissha Co., Ltd., Kyoto (JP)

(72) Inventors: Takeshi Nishimura, Kyoto (JP); Kenta Ueda, Kyoto (JP); Shinya Kawamura, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 16/780,927

(22) Filed: Feb. 4, 2020

(65) Prior Publication Data
US 2020/0177181 A1 Jun. 4, 2020

Related U.S. Application Data

(63) Continuation of application No. PCT/JP2019/001196, filed on Jan. 17, 2019.

(30) Foreign Application Priority Data

Mar. 9, 2018 (JP) .............................. JP2018-042530

(51) Int. Cl.
*H03K 17/96* (2006.01)
*H05K 1/02* (2006.01)
(Continued)

(52) U.S. Cl.
CPC ......... *H03K 17/962* (2013.01); *H05K 1/0218* (2013.01); *H05K 1/0274* (2013.01);
(Continued)

(58) Field of Classification Search
CPC ..... H03K 17/962; H03K 2217/960765; H05K 1/0218; H05K 1/0277; H05K 3/027; H05K 3/06; H05K 2201/10151; H05K 1/118
(Continued)

(56) References Cited

U.S. PATENT DOCUMENTS 4,143,253 A * 3/1979 Wagner ................ H01H 13/702
 200/5 A
4,484,038 A * 11/1984 Dorman ............... H01H 13/702
 200/5 A
(Continued)

FOREIGN PATENT DOCUMENTS

JP 2010-086498 A 4/2010
JP 2012-008621 A 1/2012
(Continued)

OTHER PUBLICATIONS

Decision to Grant a Patent received for Japanese Patent Application No. 2018-042530, dated Aug. 13, 2019, 5 pages including English Translation.

*Primary Examiner* — Sherman Ng
(74) *Attorney, Agent, or Firm* — Xsensus LLP

(57) ABSTRACT

Object:
To provide an FPC integrated capacitance switch and a method of manufacturing the same, which allow an FPC portion to have high electrical reliability when used in a bent manner and to have wiring lines to be densely arranged.
Solution:
The FPC integrated capacitance switch includes a transparent flexible substrate (1) including a sensor unit (11) and a tail portion (12), a plurality of electrodes (2) formed on a first main surface (1a) of the transparent flexible substrate (1) and in the sensor unit (11), a plurality of first electrode wiring lines (21), a plurality of second electrode wiring lines (22) arranged and formed in parallel in the tail portion (12) and made of a photoresist including conductive particles, an electromagnetic shield (3) formed on a second main surface (1b) of the transparent flexible substrate (1) overlapping in plan view a region including the plurality of electrodes (2), a pair of first electromagnetic shield wiring lines (31), a pair of second electromagnetic shield wiring lines (32) formed in (Continued)

the tail portion (12) to be arranged in plan view outward of a region including the plurality of second electrode wiring lines (22), the second electromagnetic shield wiring lines (32) being made of a photoresist including conductive particles, and an electromagnetic shield mask (33) formed on the second main surface (1b) of the transparent flexible substrate (1) overlapping in plan view the region including the plurality of second electrode wiring lines (22), the electromagnetic shield mask (33) including a light-shielding metal film.

10 Claims, 28 Drawing Sheets

(51) Int. Cl.
   *H05K 1/09* (2006.01)
   *H05K 1/16* (2006.01)
   *H05K 3/00* (2006.01)
   *H05K 3/02* (2006.01)
   *H05K 3/06* (2006.01)
   *G04G 21/08* (2010.01)

(52) U.S. Cl.
   CPC ........... *H05K 1/0277* (2013.01); *H05K 1/092* (2013.01); *H05K 1/162* (2013.01); *H05K 3/0044* (2013.01); *H05K 3/027* (2013.01); *H05K 3/06* (2013.01); *G04G 21/08* (2013.01); *H03K 2217/960765* (2013.01); *H05K 2201/0715* (2013.01); *H05K 2201/09236* (2013.01); *H05K 2201/10151* (2013.01)

(58) Field of Classification Search
   USPC .......................................... 324/658; 174/254
   See application file for complete search history.

(56) References Cited

U.S. PATENT DOCUMENTS

| 4,920,343 | A  | * | 4/1990 | Schwartz | ............... | H03K 17/98 |
|---|---|---|---|---|---|---|
| | | | | | | 200/5 A |
| 2008/0202251 | A1 | * | 8/2008 | Serban | ................. | H03K 17/962 |
| | | | | | | 73/780 |
| 2009/0002339 | A1 | * | 1/2009 | Reynolds | ............. | H03K 17/962 |
| | | | | | | 345/174 |
| 2016/0282989 | A1 | * | 9/2016 | Hirakata | ............... | G06F 3/0443 |
| 2017/0139511 | A1 | * | 5/2017 | Ohsawa | ................. | G06F 3/045 |

FOREIGN PATENT DOCUMENTS

| JP | 2013-149392 A | 8/2013 |
|---|---|---|
| JP | 2013-214173 A | 10/2013 |
| JP | 2014-160558 A | 9/2014 |
| JP | 2015-215735 A | 12/2015 |

\* cited by examiner

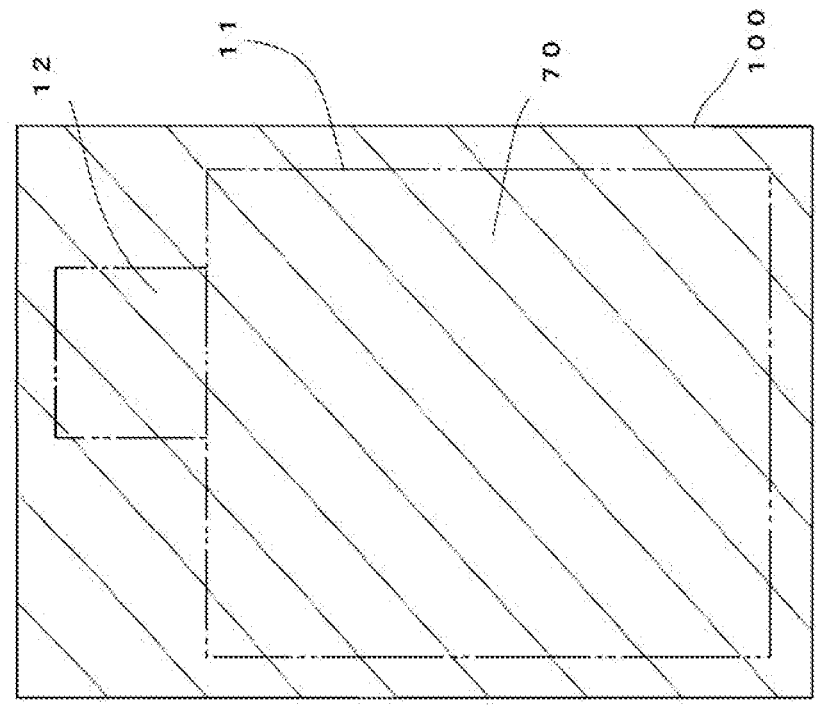
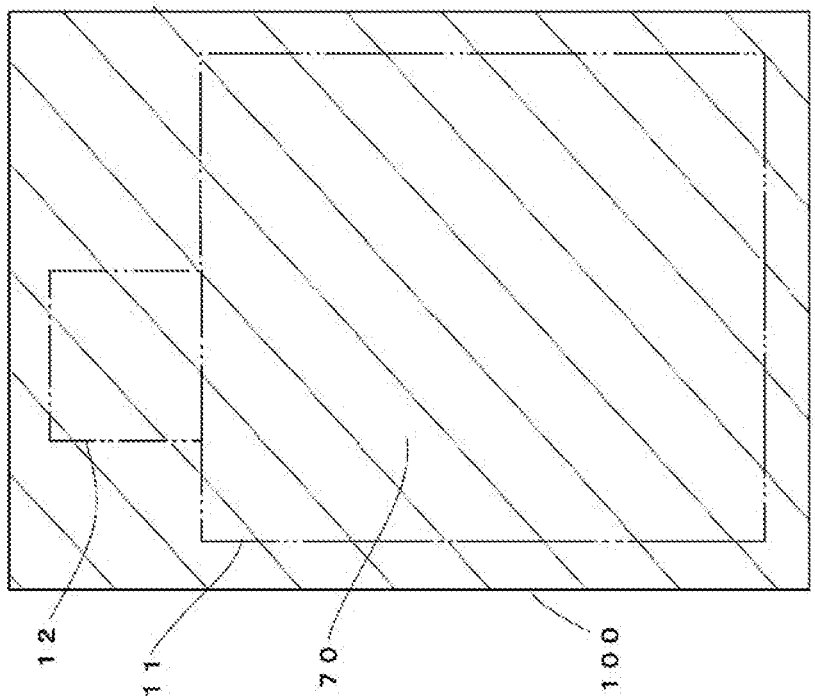

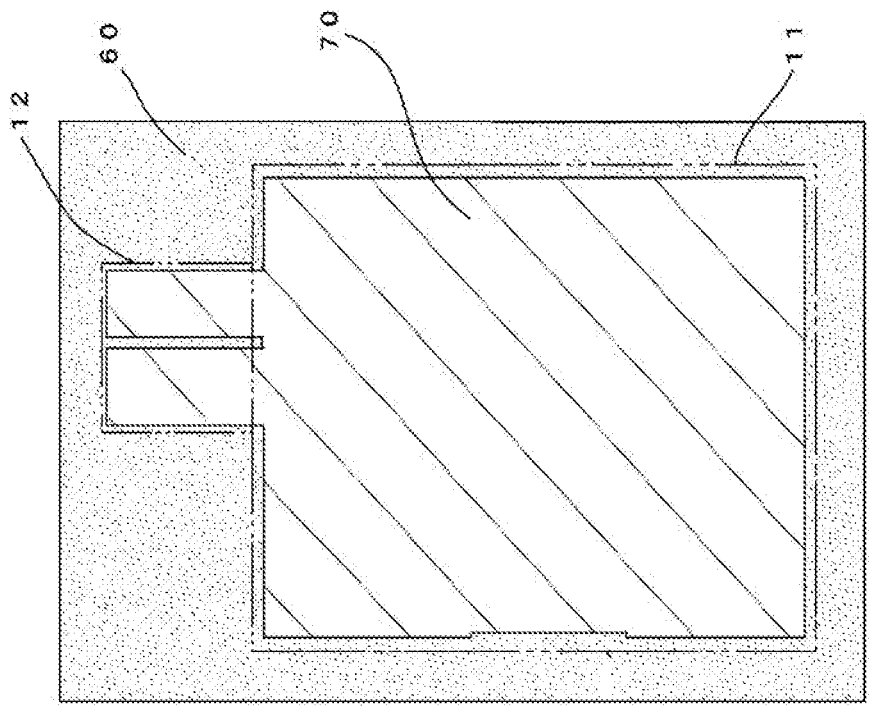
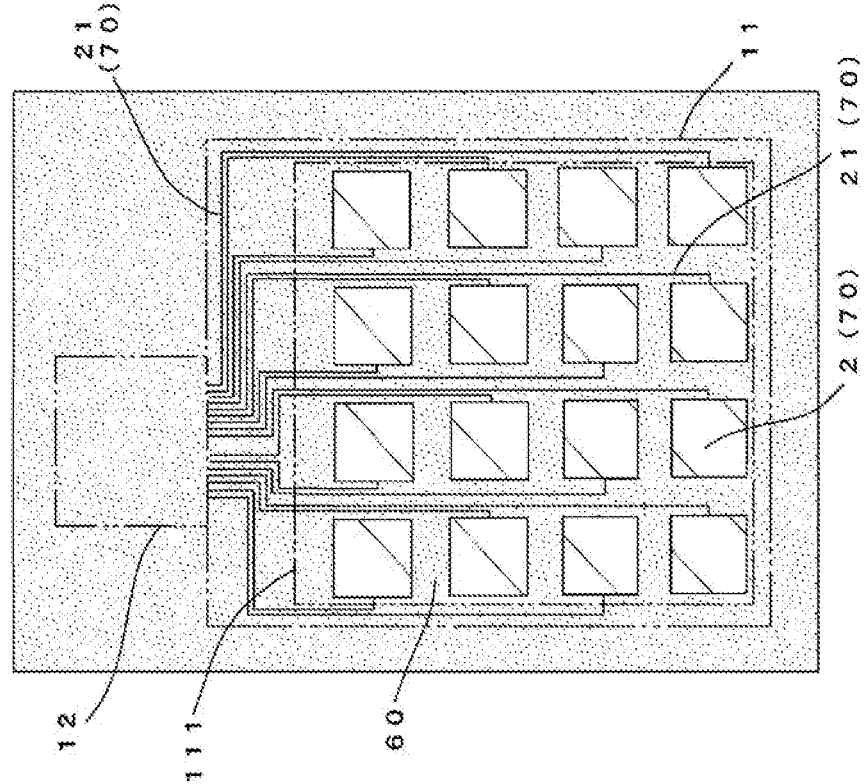
FIG. 5B
FIG. 5A

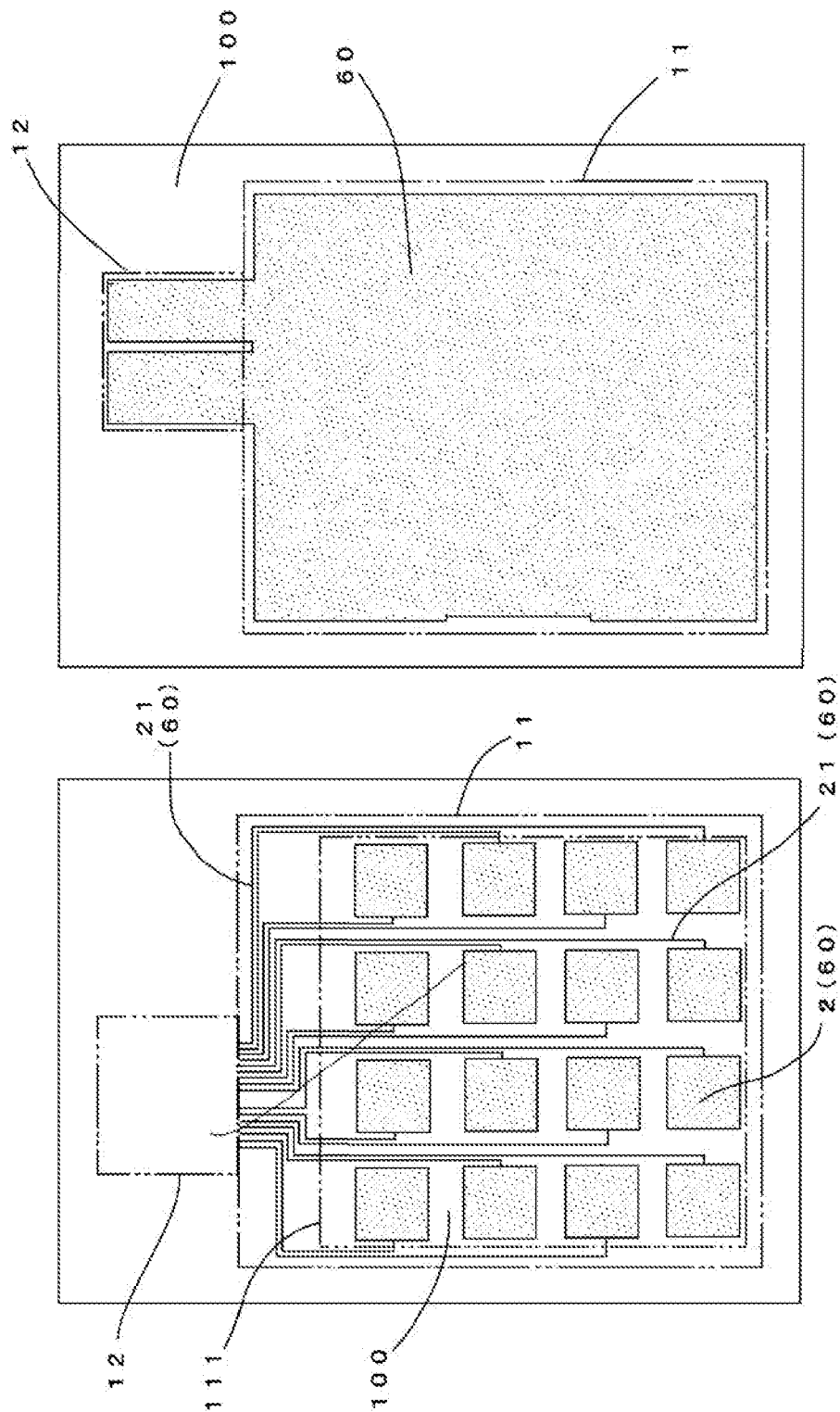

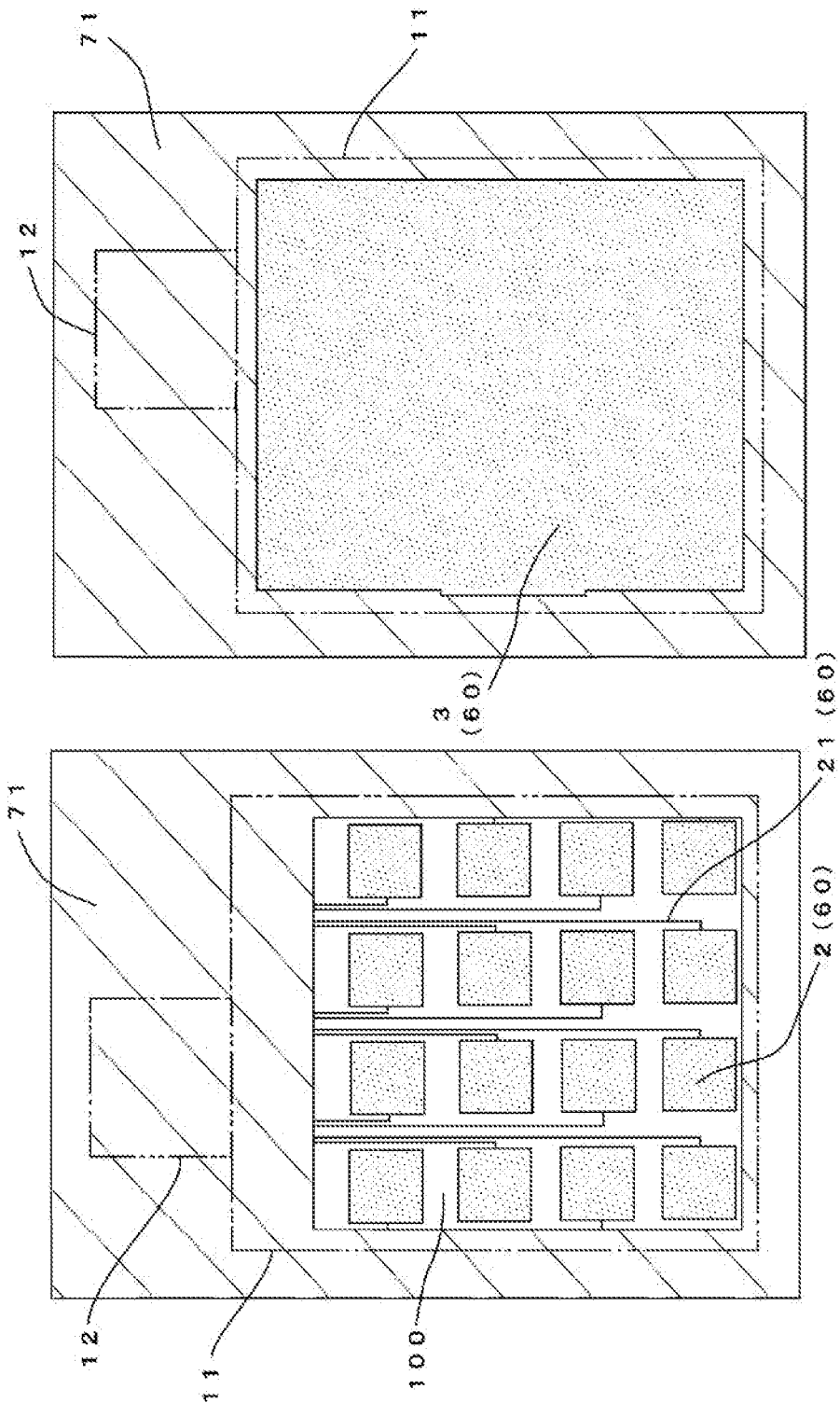

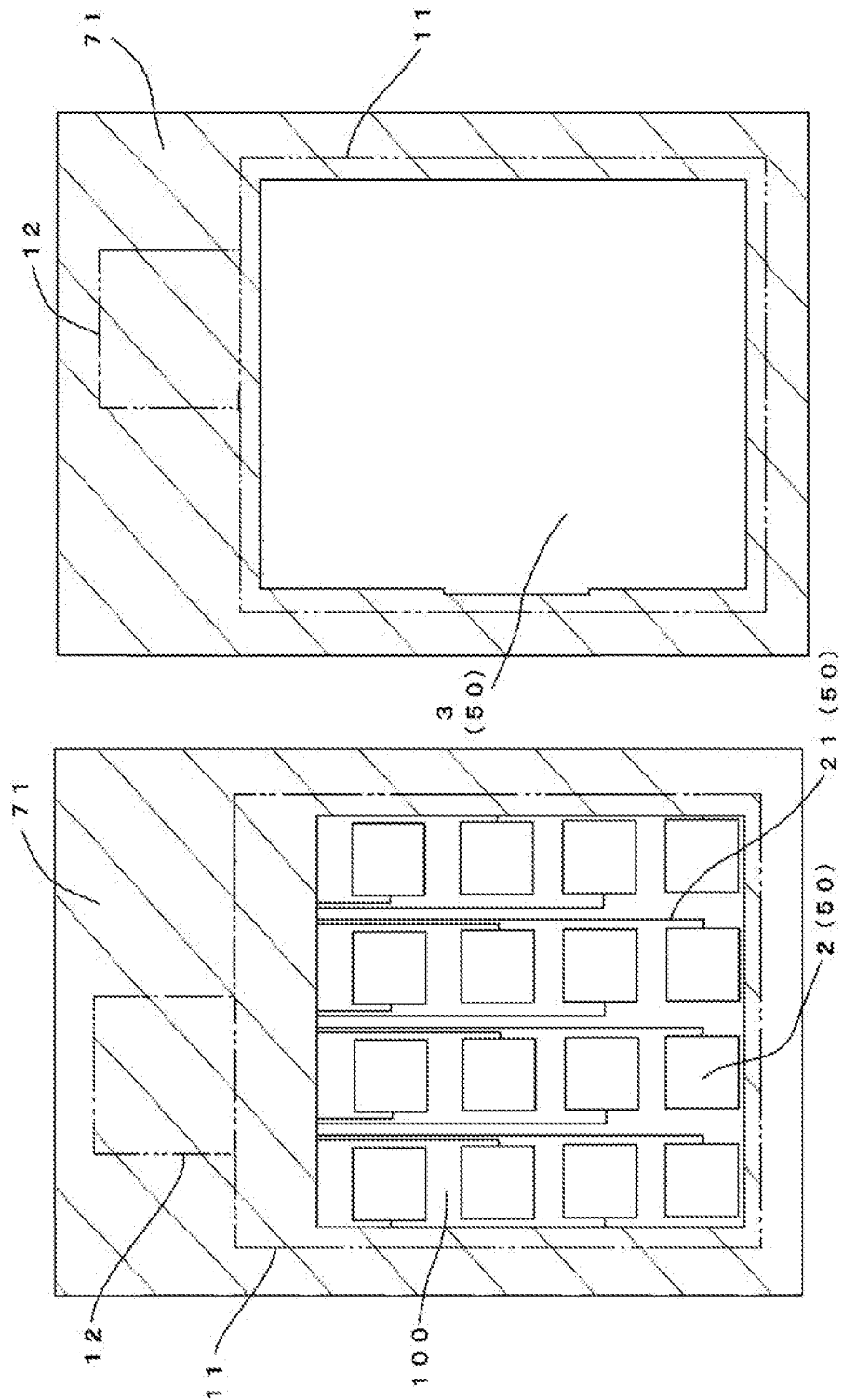

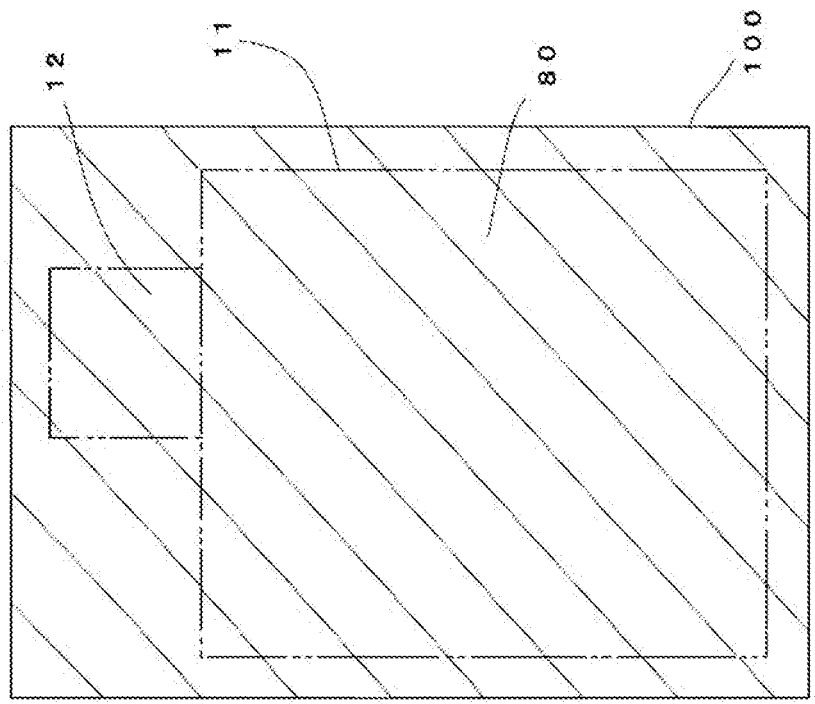
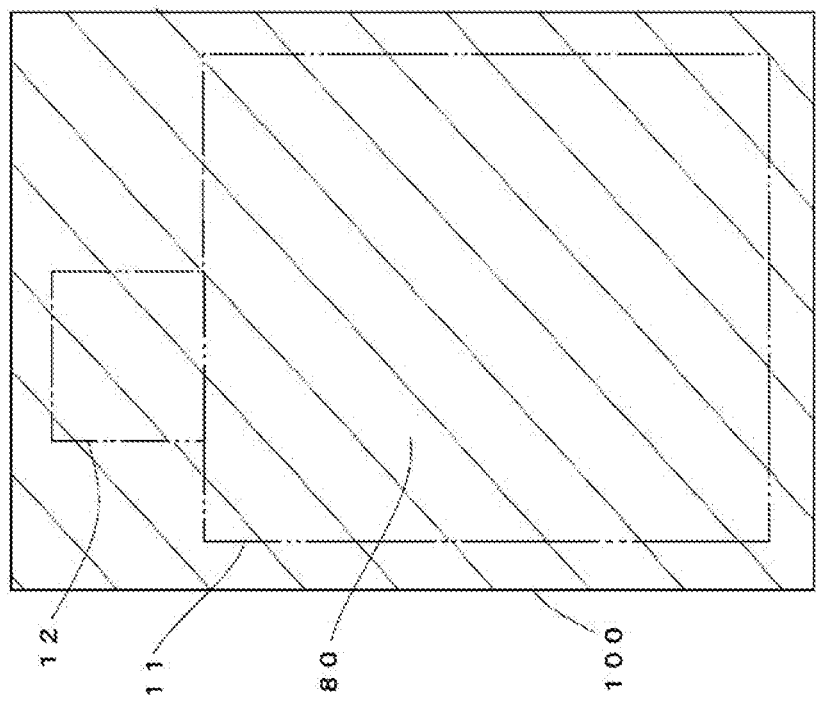
FIG. 12A
FIG. 12B

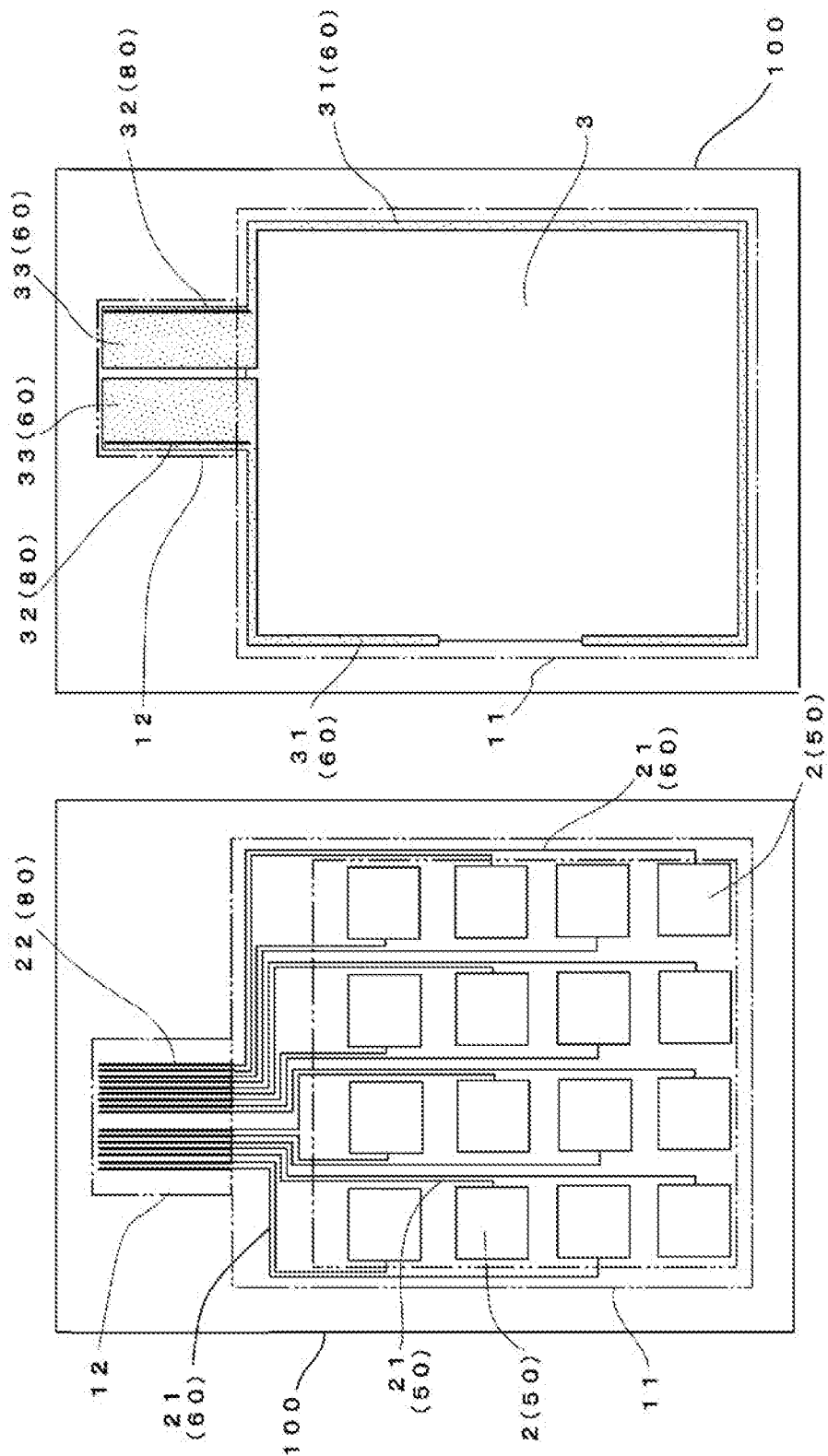

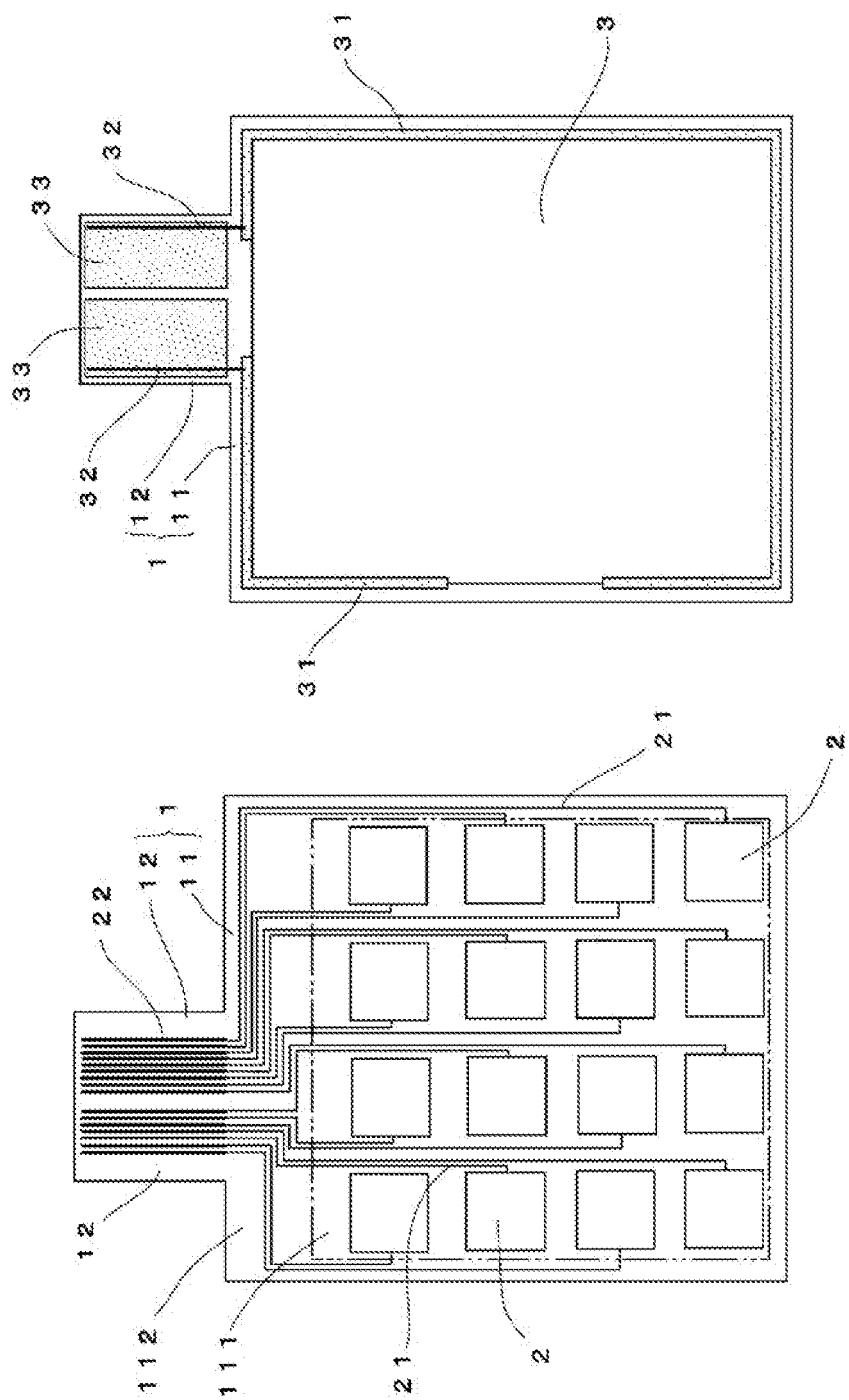

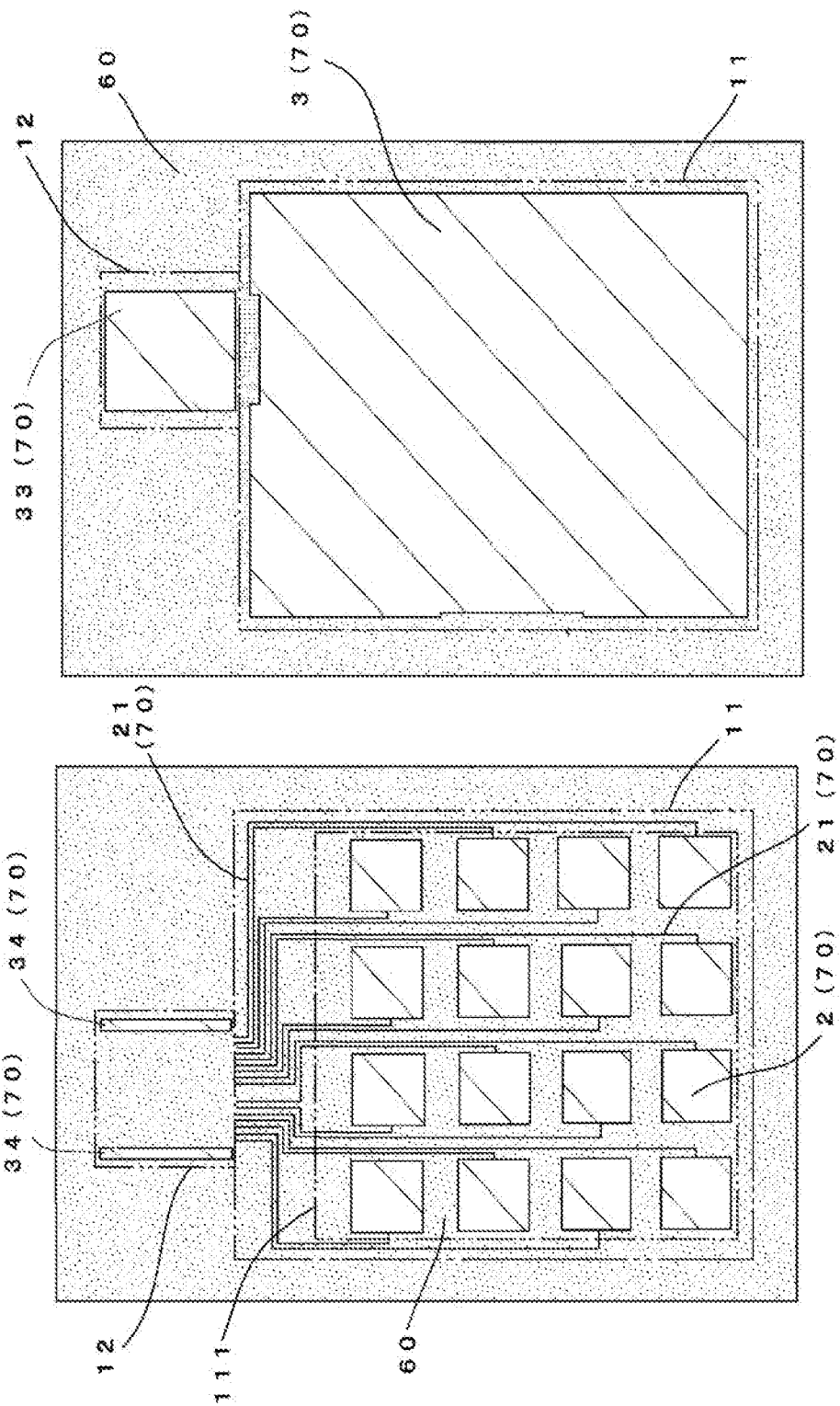

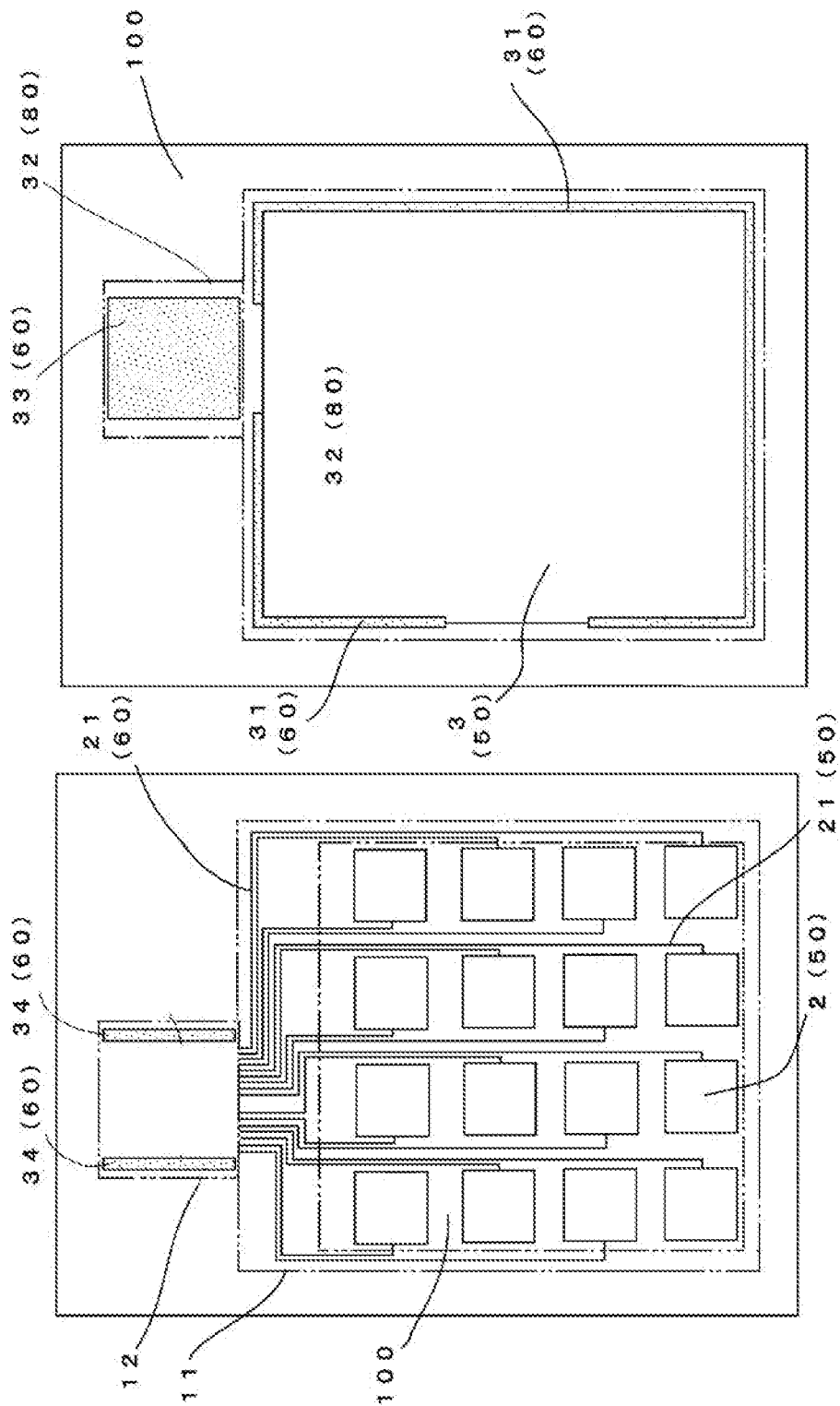

FPC INTEGRATED CAPACITANCE SWITCH AND METHOD OF MANUFACTURING THE SAME

CROSS REFERENCES TO RELATED APPLICATIONS

This application is a continuation of International Application No. PCT/JP2019/001196, filed on Jan. 17, 2019, which claims priority to Japanese Patent Application 2018-042530, filed on Mar. 9, 2018, which is incorporated herein by reference.

TECHNICAL FIELD

The present disclosure relates to an FPC integrated capacitance switch used in a watch, an in-vehicle equipment, or the like, and a method of manufacturing the FPC integrated capacitance switch.

BACKGROUND

As described, for example, in Patent Document 1, a conventional capacitance switch includes a flexible substrate that is flexible and transparent, plural transparent electrodes formed in a region other than a peripheral portion of one surface of the flexible substrate, plural electrode wiring lines (wiring lines) formed in connection with the plural transparent electrodes. The capacitance switch is installed on a display device of a wristwatch, an in-vehicle equipment, or the like. A capacitor is formed between the plural transparent electrodes and a finger when the finger is selectively placed close to the plural transparent electrodes, and change in capacitance is detected.

Further, a so-called FPC integrated capacitance switch is also described in Patent Document 1. The FPC integrated capacitance switch is structured such that a portion of a peripheral portion of a flexible substrate is extended to form a flexible extended connection piece and such that plural electrode wiring lines (wiring lines) are disposed to extend on one surface of the extended connection piece to form an FPC portion. The capacitance switch body and the flexible substrate of the FPC portion are integrated, and thus it is unnecessary to separately prepare and connect an FPC. Therefore, the number of components can be reduced.

In addition, the capacitance switch may be structured such that an electromagnetic shield made of a transparent conductive film is formed on the other surface of the flexible substrate, which is opposite to the surface provided with the transparent electrodes, in order to reduce harmful noise that causes improper operations from the display device. In this case, a pair of electromagnetic shield wiring lines connected to the electromagnetic shield is formed to extend to the extended connection piece.

CITATION LIST

Patent Literature

Patent Document 1: JP 2014-160558 A

SUMMARY

Technical Problem

However, in order to reduce the size of a product in which the capacitance switch is used, it is necessary to bend the FPC portion of the capacitance switch and connect the bent FPC portion to a circuit board or the like. In addition, in order to reduce the size of the FPC portion itself, it is necessary to densely arrange the electrode wiring lines of the FPC portion, that is, to reduce the wiring width and to reduce a gap between the wiring lines.

Therefore, an object of the present disclosure is to provide an FPC integrated capacitance switch and a method of manufacturing the same, which allow an FPC portion to have high electrical reliability when used in a bent manner and to have wiring lines to be densely arranged.

Solution to Problem

Some aspects are described below as means to solve the problems. These aspects can be combined optionally, as needed.

An FPC integrated capacitance switch according to an aspect of the present disclosure includes a transparent flexible substrate made of a resin film and including a sensor unit and a tail portion that extends from an edge of the sensor unit, a plurality of electrodes formed on a first main surface of the transparent flexible substrate and in the sensor unit, a plurality of first electrode wiring lines electrically connected to the plurality of electrodes and collectively formed to extend to the edge located adjacent to the tail portion, a plurality of second electrode wiring lines electrically connected to the plurality of first electrode wiring lines and formed in the tail portion to be arranged in parallel, the second electrode wiring lines being made of a photoresist including conductive particles, an electromagnetic shield formed on a second main surface that is an opposite surface opposite to the first main surface of the transparent flexible substrate, overlapping in plan view a region including the plurality of electrodes, a pair of first electromagnetic shield wiring lines electrically connected to the electromagnetic shield and formed to extend to the edge located adjacent to the tail portion; and a pair of second electromagnetic shield wiring lines electrically connected to the pair of first electromagnetic shield wiring lines and formed in the tail portion to be arranged in plan view outward of a region including the plurality of second electrode wiring lines, the second electromagnetic shield wiring lines being made of a photoresist including conductive particles,f and an electromagnetic shield mask formed on the second main surface of the transparent flexible substrate and in the tail portion overlapping in plan view the region including the plurality of second electrode wiring lines, the electromagnetic shield mask including a light-shielding metal film.

The FPC integrated capacitance switch is structured such that the plurality of second electrode wiring lines formed in the tail portion and the pair of second electromagnetic shield wiring lines formed in the tail portion are made of the photoresists including electrically conductive particles. Therefore, wiring of an FPC portion does not break even when used in a bent manner, which leads to high electrical reliability. Further, the wiring pattern can be obtained by exposing and developing a film made of a photoresist containing conductive particles, therefore, the plurality of second electrode wiring lines can be densely arranged.

Furthermore, in the process of the present disclosure, the present inventors discovered that the exposure and development of a film made of a photoresist containing conductive particles is a process of forming wiring of the FPC portion and thus the following new problems occur.

That is, when a film formed on one surface of the transparent flexible substrate and made of a photoresist including conductive particles, is exposed, the light reaches a film formed on the opposite surface of the transparent flexible substrate and made of a photoresist containing conductive particles, and thus the film on the opposite surface is also exposed. Therefore, the same wiring pattern as the plurality of second electrode wiring lines is formed through on the backside of the transparent flexible substrate (hereinafter, such an event will be referred to as back transfer).

Crimping is used as a method of bending the FPC portion of the capacitance switch to connect the bent FPC portion to a circuit board or the like. However, it was found that when a back-transfer pattern of the plurality of second electrode wiring lines is present, the transparent flexible substrate is pushed into a gap of the back-transfer pattern by pressure at the time of crimping; therefore, waving occurs. Crimping under such a waving state may cause the plurality of second electrode wiring lines to be damaged and broken.

Therefore, in addition to the components described above, the present inventors provides an electromagnetic shield mask formed on the second main surface of the transparent flexible substrate and in the sensor unit overlapping in plan view the region including the plurality of second electrode wiring lines, and the electromagnetic shield mask includes a light-shielding metal film.

With such a configuration, the back-transfer pattern of the plurality of second electrode wiring lines can be prevented from being formed. Specifically, after forming the electromagnetic shield mask including the light-shielding metal film on the second main surface of the transparent flexible substrate, a film made of a photoresist including conductive particles for forming a pair of electromagnetic shield wiring lines is formed. Therefore, light exposure to be subsequently performed for forming the plurality of second electrode wiring lines does not reach a portion of the film where the electromagnetic shield mask is present, and thus the back-transfer pattern is not formed. As a result, breaking does not occur at the time of crimping, which leads to high electrical reliability.

Further, the electromagnetic shield mask may be divided into portions, and the pair of second electromagnetic shield wiring lines may be separated and overlapping a surface of the divided portions of the electromagnetic shield mask, the surface is opposite to the transparent flexible substrate. In this case, the electromagnetic shield mask may be electrically connected to the pair of first electromagnetic shield wiring lines or may be independent from the pair of first electromagnetic shield wiring lines.

Furthermore, the pair of second electromagnetic shield wiring lines may not be overlapped with the electromagnetic shield mask, and a pair of electrode masks including a light-shielding metal film may be further provided, the electrode masks being formed on the first main surface of the transparent flexible substrate and in the tail portion overlapping the pair of second electromagnetic shield wiring lines in plan view.

With such a configuration, the electrical reliability can be further improved.

First, the pair of second electromagnetic shield wiring lines is not overlapped with the electromagnetic shield mask. Accordingly, even when cracking occurs in the electromagnetic shield mask, such cracking does not affect the second electromagnetic shield wiring lines.

In addition, a back-transfer pattern of the pair of second electromagnetic shield wiring lines can be prevented from being formed. Specifically, after forming the electrode mask including the light-shielding metal film on the first main surface of the transparent flexible substrate, a film made of a photoresist including conductive particles for forming the plurality of second electrode wiring lines is formed. Therefore, light exposure to be subsequently performed for forming the pair of second electromagnetic shield wiring lines does not reach a portion of the film where the electromagnetic shield mask is present, and thus the back-transfer pattern is not formed.

As a result, the back-transfer patterns are not formed to the first main surface and the second main surface of the transparent flexible substrate on the first main surface side, and thus in the regions where the plurality of second electrode wiring lines and the pair of second electromagnetic shield wiring lines are formed, the layered materials are the same and only the layer-stacking order is different. In other words, no difference occurs in thickness. When the thickness of opposite ends of the tail portion between which the region (center portion) including the plurality of second electrode wiring lines is interposed is increased by the back-transfer pattern, the opposite ends have high rigidity, and thus the center portion is easily twisted. However, when the back-transfer pattern of the pair of second electromagnetic shield wiring lines is not formed, the center portion is not twisted.

Further, the sensor unit may include a view area and a frame area surrounding the view area, and the electrodes, the first electrode wiring lines, and the electromagnetic shield may be transparent on the view area.

The conductive particles included in the second electrode wiring lines and the second electromagnetic shield wiring lines may be any one of metallic powder, a particle formed by coating a surface of a core element with a conductive layer, carbon, and graphite. Furthermore, the light-shielding metal film of the electromagnetic shield mask may be made any one of copper, silver, tin, aluminum, and nickel.

A plurality of terminals formed on the first main surface of the transparent flexible substrate and at an end portion of the tail portion may be further provided, and the plurality of second electrode wiring lines may be electrically connected on to the terminals.

A method of manufacturing the aforementioned FPC integrated capacitance switch includes;

[1] a process of using a transparent flexible substrate raw material made of resin film, includes, in a plane, a sensor unit and a tail portion extending from an edge of the sensor unit, and stacking a transparent conductive film, a light-shielding metal film, and a first photoresist in layers in the mentioned order on each of a first main surface of the transparent flexible substrate raw material and a second main surface which is an opposite surface of the first main surface;

[2] a process of partially exposing, developing the first photoresist on the first main surface and patterning the first photoresist into the shape coinciding with the plurality of electrodes and the plurality of first electrode wiring lines, and partially exposing, developing the first photoresist on the second main surface and patterning the first photoresist into the shape coinciding with the electromagnetic shield, the pair of first electromagnetic shield wiring lines, and the electromagnetic shield mask;

[3] a process of etching the transparent conductive film that is uncovered and the light-shielding metal film;

[4] a process of stripping the first photoresist after etching;

[5] a process of forming a second photoresist on each of the first main surface from which the first photoresist is stripped and the second main surface from which the first photoresist is stripped;

[6] a process of partially exposing, developing the second photoresist on the first main surface and uncovering the light-shielding metal film in a view area, and partially exposing, developing the second photoresist on the second main surface and uncovering the electromagnetic shield;

[7] a process of etching only the light-shielding metal film that is uncovered;

[8] a process of stripping the second photoresist after etching;

[9] a process of forming, on each of the first main surface from which the second photoresist is stripped and the second main surface from which the second photoresist is stripped, a third photoresist including conductive particles;

[10] a process of partially exposing, developing the third photoresist on the first main surface and patterning the third photoresist into the shape of the plurality of second electrode wiring lines, and partially exposing, developing the third photoresist on the second main surface and patterning the third photoresist into the shape of the pair of second electromagnetic shield wiring lines; and

[11] a process of finally punching the transparent flexible substrate raw material into the shape of a transparent flexible substrate including the sensor unit and the tail portion.

In the manufacturing method, the plurality of first electrode wiring lines outside the view area and the pair of first electromagnetic shield wiring lines are formed of a laminate of the transparent conductive film and the light-shielding metal film, and thus the resistance of the wiring lines is sufficiently low. As a result, a sufficient reaction rate for an input operation is obtained, and consumption current is sufficiently suppressed. Moreover, since the electromagnetic shield mask is patterned from the same lamination of the transparent conductive film and the light-shielding metal film, a separate process for forming the electromagnetic shield mask is not necessary.

Further, in a case where the FPC integrated capacitance switch includes the electrode masks, in the process [2], in addition to patterning into the shape coinciding with the plurality of electrodes and the plurality of first electrode wiring lines, patterning into the shape coinciding with the pair of electrode masks is performed at the time of partially exposing and developing the first photoresist on the first main surface.

Advantageous Effects of Disclosure

The FPC integrated capacitance switch according to the present disclosure can be structured such that the FPC portion has high electrical reliability when used in a bent manner or at the time of crimping and such that the wiring lines are densely arranged.

BRIEF DESCRIPTION OF DRAWINGS

FIGS. 4A and 4B are schematic diagrams illustrating the manufacturing process of the capacitance switch according to the first embodiment of the present disclosure.

FIGS. 5A and 5B are schematic diagrams illustrating the manufacturing process of the capacitance switch according to the first embodiment of the present disclosure.

FIGS. 7A and 7B are schematic diagrams illustrating the manufacturing process of the capacitance switch according to the first embodiment.

FIGS. 9A and 9B are schematic diagrams illustrating the manufacturing process of the capacitance switch according to the first embodiment of the present disclosure.

FIGS. 10A and 10B are schematic diagrams illustrating the manufacturing process of the capacitance switch according to the first embodiment of the present disclosure.

FIGS. 12A and 12B are schematic diagrams illustrating the manufacturing process of the capacitance switch according to the first embodiment of the present disclosure.

FIGS. 13A and 13B are schematic diagrams illustrating the manufacturing process of the capacitance switch according to the first embodiment of the present disclosure.

FIGS. 14A and 14B are schematic diagrams illustrating the FPC integrated capacitance switch according to a second embodiment of the present disclosure.

FIGS. 16A and 16B are schematic diagrams illustrating a manufacturing process of the capacitance switch according to the third embodiment of the present disclosure.

FIGS. 19A and 19B are schematic diagrams illustrating the manufacturing process of the capacitance switch according to the third embodiment of the present disclosure.

DETAILED DESCRIPTION

Herein, embodiments will be described with reference to the drawings. However, the present disclosure is not limited to the embodiments specifically described below.

1. First Embodiment (FPC Integrated Capacitance Switch)

Figures 1A, 1B:
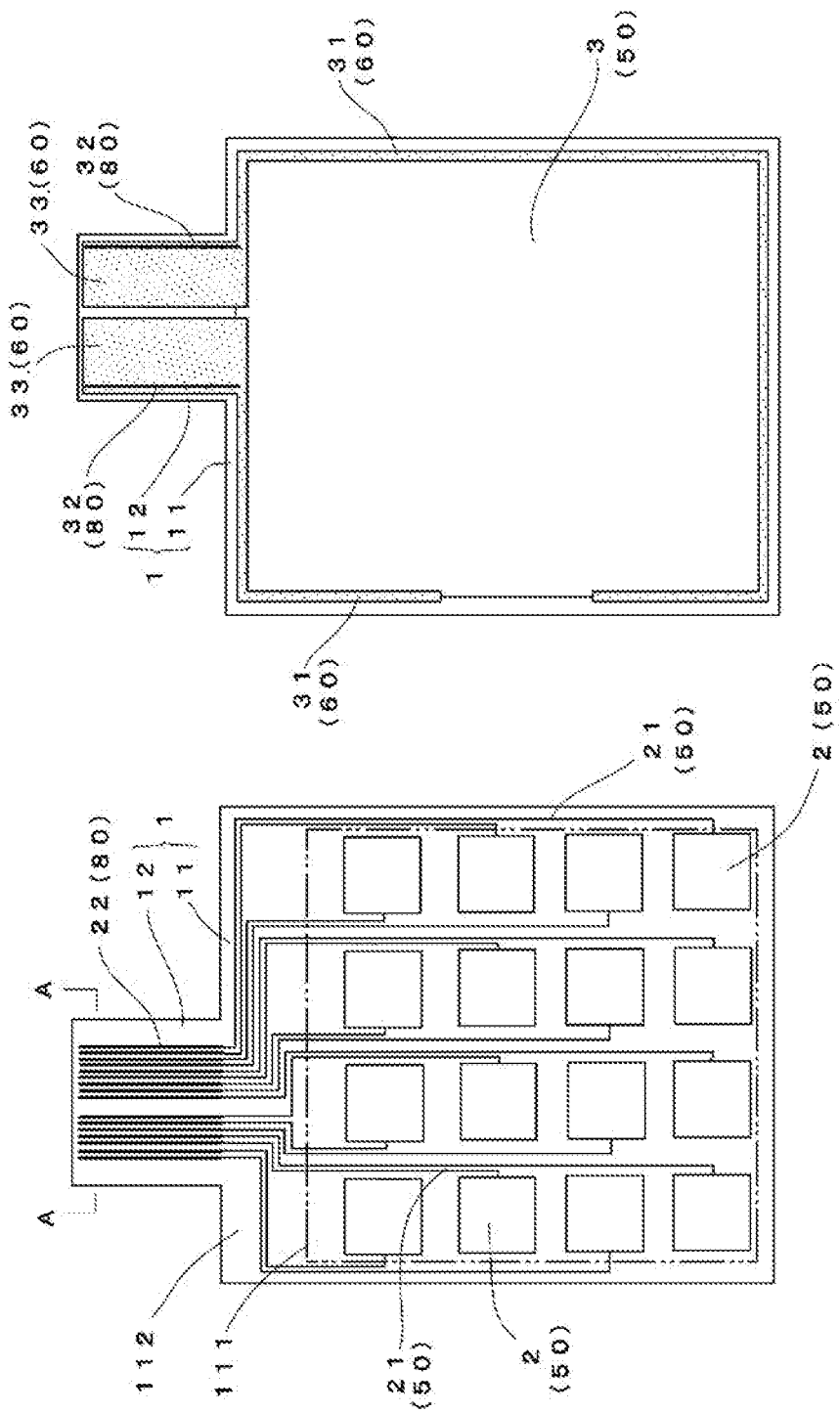
FIGS. 1A and 1B are schematic diagrams illustrating an FPC integrated capacitance switch according to a first embodiment of the present disclosure.
Figure 2:
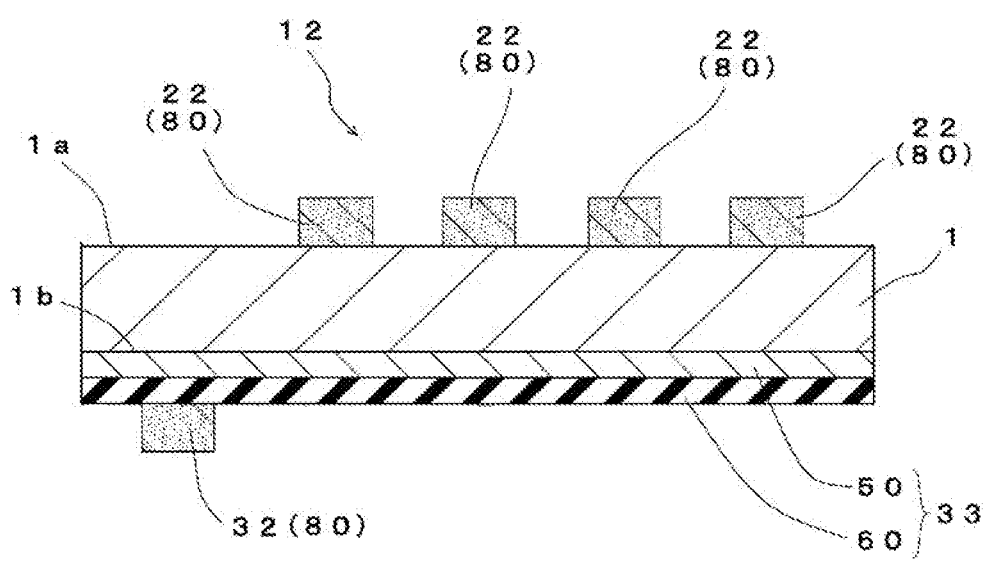
FIG. 2 is a partially enlarged cross-sectional view illustrating a cross-section taken along the line A-A of FIG. 1A.

FIGS. 1A and 1B are schematic diagrams illustrating an FPC integrated capacitance switch according to a first embodiment of the present disclosure. FIG. 2 is a partial cross-sectional view illustrating a cross-section taken along the line A-A of FIG. 1A. Note that FIGS. 1A and 1B illustrate views of a transparent flexible substrate 1 respectively seen from a first main surface 1a and a second main surface 1b of the transparent flexible substrate 1. In addition, the reference signs surrounded by parentheses in the drawings indicate layers of the outermost surface uncovered in the schematic diagrams.

An FPC integrated capacitance switch 5 includes: a transparent flexible substrate 1, plural electrodes 2, plural first electrode wiring lines 21, and plural second electrode wiring lines 22, all of which are formed on a first main surface 1a of the transparent flexible substrate 1; and an electromagnetic shield 3, a pair of first electromagnetic shield wiring lines 31, an electromagnetic shield mask 33, and a pair of second electromagnetic shield wiring lines 32, all of which are formed on a second main surface 1b that is an opposite surface opposite to the first main surface 1a of the transparent flexible substrate 1.

<Transparent Flexible Substrate>

As illustrated in FIGS. 1A and 1B, the transparent flexible substrate 1 includes a sensor unit 11 that is a base member of a capacitance switch body, and a tail portion 12 that is a base member of an FPC portion extending from an edge of the sensor unit 11. In addition to the rectangular shape illustrated in FIGS. 1A and 1B, a shape of the sensor unit 11 may be formed in another manner, for example, a circle, square, triangle, polygon, or the like depending on the intended use of the FPC integrated capacitance switch 5.

Further, the transparent flexible substrate 1 is made of a resin film. As long as the substrate is made of a flexible material having transmittance of 90% or greater, the material of the substrate is not especially limited. A film such as polyethylene terephthalate (PET), polycarbonate (PC), polymethyl methacrylate (PMMA), polyethylene naphthalate (PEN), polyethersulfone (PES), cyclic olefin copolymer (COC), triacetyl cellulose (TAC) film, polyvinyl alcohol (PVA) film, polyimide (PI) film, polystyrene (PS), or biaxially oriented polystyrene (biaxially oriented PS or BOPS) or a laminated body thereof is used as the material of the substrate. Preferably, the material of the substrate may be polyethylene terephthalate (PET), polyimide (PI), polycarbonate (PC), triacetyl cellulose (TAC) film, or the like.

Alternatively, the transparent flexible substrate 1 may be a single layer or a laminated body in which two or more layers are stacked. In addition, the thickness of the transparent flexible substrate 1 is normally 20 μm or greater for each single layer thickness, and the total thickness of each of the films is 500 μm or less. This is because handling at the time of manufacturing films is difficult when the single layer thickness is below 20 μm and because transparency and flexibility deteriorate when the total thickness is greater than 500 μm.

<Electrode>

As illustrated in FIG. 1A, on the first main surface 1a of the transparent flexible substrate 1, the plural electrodes 2 each made of a transparent conductive film 50 are formed in a rectangular view area 111 defined in the sensor unit 11. The plural electrodes 2 configure a detection electrode of the capacitance switch, and the plural electrodes 2 each formed in a square are arranged vertically and horizontally in a 4 by 4 matrix.

The transparent conductive film 50 may include, for example, a metal oxide film such as tin oxide, indium oxide, antimony oxide, zinc oxide, cadmium oxide, or indium tin oxide (ITO) or may include a composite film mainly containing such a metal oxide. The metal oxide film and the composite film may be formed by a vacuum deposition method, a sputtering method, an ion plating method, or the like. The film is formed to have a thickness of tens to hundreds nm, and with a ferric chloride solution and the like, the film is easily etched together with a light-shielding metal film 60. However, it is necessary that etching is not easily performed on the light-shielding metal film 60 with an etching solution such as hydrogen peroxide water in an acidic atmosphere. In addition, preferably, the film exhibits light transmittance of 80% or greater and a surface resistance value of from several mΩ to several hundreds Ω.

<First Electrode Wiring Line>

As illustrated in FIG. 1A, on the first main surface 1a of the transparent flexible substrate 1, the plural first electrode wiring lines 21 are electrically connected to the plural electrodes 2 and are collectively formed, in the sensor unit, 11 extending to the edge thereof located adjacent to the tail portion 12.

As illustrated in FIG. 1A, the first electrode wiring lines 21 are made of the same transparent conductive film 50 as the electrodes 2 in the view area 111 defined in the sensor unit 11. Further, as illustrated in FIG. 1A and FIG. 2, the plural first electrode wiring lines 21 are, in a residual frame area 112 surrounding the view area 111 in the sensor unit 11, a laminate body in which the transparent conductive film 50 and the light-shielding metal film 60 are stacked in the mentioned order from the transparent flexible substrate 1.

The transparent conductive film 50 of the first electrode wiring line 21 is integrally formed with the electrode 2. In other words, since the transparent conductive film 50 is made of the same material as the electrode 2, the material will not be described.

A portion of the first electrode wiring lines 21, which is formed outside of the view area 111 does not need to be transparent. Therefore, the light-shielding metal film 60 made of a material having higher conductivity than that of the transparent conductive film 50 and superior light-shielding properties can be stacked on the transparent conductive film 50.

The light-shielding metal film 60 having the conductivity higher than that of the transparent conductive film 50 is stacked, and thus the first electrode wiring lines 21 located outside of the view area 111 have a sufficiently low resistance. As a result, a sufficient reaction rate for an input operation is obtained, and consumption current is sufficiently suppressed.

An example of the light-shielding metal film 60 may include a metal film of single one of copper, silver, tin, aluminum, nickel, and the like, or an alloy or a compound containing one or more of these elements. Particularly, copper is preferable. The materials for the light-shielding metal film 60 may be formed by a vacuum deposition method, a sputtering method, an ion plating method, or the like. The light-shielding metal film 60 is formed to have a thickness of 20 to 1000 nm and more preferably of 30 nm or greater. Still more preferably, the thickness of the light-shielding metal film is 100 to 500 nm. This is because the light-shielding metal film 60 having high-conductivity can be obtained when the thickness is 100 nm or greater, and because the light-shielding metal film 60 with ease of handling and excellent in workability can be obtained when the thickness is 500 nm or less.

<Second Electrode Wiring Line>

As illustrated in FIG. 1A, on the first main surface 1a of the transparent flexible substrate 1, the plural second electrode wiring lines 22 electrically connected to the first electrode wiring lines 21 are formed in the tail portion 12 having strip-shape extending from the edge of the sensor unit 11. The plural second electrode wiring lines 22 configure wiring of an FPC portion, and are arranged in parallel side by side.

As illustrated in FIG. 1A, each of the second electrode wiring lines 22 formed by a third photoresist 80 including conductive particles.

The second electrode wiring line 22 formed by the third photoresist 80 is obtained by, in a manufacturing process of the capacitance switch 5, exposing, developing and subsequently patterning the third photoresist 80. Accordingly, the wiring width can be reduced compared with a printed pattern typically used in FPC wiring, and a gap between the wiring lines can be reduced. In other words, the wiring lines can be densely arranged.

In addition, the third photoresist 80 is formed with a photosensitive resin as a base having an excellent bending property and thus is resistant to breaking when used in a bent manner, which leads to high electrical reliability.

The base of the third photoresist 80 includes a photosensitive resin that can be exposed to light with a carbon arc lamp, a mercury vapor arc lamp, an ultrahigh pressure mercury lamp, a high-pressure mercury lamp, a xenon lamp, or the like and be developed with an alkaline aqueous solution or the like described below.

An example of the conductive particles contained in the third photoresist 80 may include metallic powder such as silver, gold, copper, nickel, platinum, palladium, or a material structured such that a core element is made of an inorganic insulator such as alumina or glass or an organic polymer such as polyethylene, polystyrene, or divinylbenzene and such that a surface of the core element is coated with a conduct layer of gold, nickel, or the like. Alternatively, the conductive particles may be carbon, graphite, or the like. Particularly, silver powder is preferable. Additionally, the conductive particles can be formed in any shape, for example, in flake form, spherical form, or short-fiber form.

A method of forming the second electrode wiring line 22 may be a general printing method such as gravure, screen, and offset printing. In addition, the second electrode wiring line 22 may be formed by a method such as a method with various coaters, coating, or dipping or may be formed by forming the entire surface of the line by various methods such as a dry film resist (DFR) lamination and the like and by exposing, developing and subsequently patterning. Of the methods, the dry film resist lamination is more preferable.

A dry film resist is different from a liquid resist in that the dry film resist is processed in advance to have a uniform film thickness. Therefore, the film thickness does not become uneven or the film does not decrease. Moreover, the time to dry an organic solvent is not needed. Therefore, when being wound, the line may not be transferred due to poor drying.

The second electrode wiring line 22 preferably has a thickness of 2 to 10 µm. More preferably, the thickness of the second electrode wiring line is 3 to 5 µm. This is because the second electrode wiring line 22 with low electrical conductivity sufficiently for use as wiring can be obtained when the thickness is 3 µm or greater and because the second electrode wiring line 22 excellent in bending resistance can be obtained when the thickness is 5 µm or less.

<Electromagnetic Shield>

As illustrated in FIG. 1B, the electromagnetic shield 3 made of the transparent conductive film 50 is formed, on the second main surface 1b that is the opposite surface opposite to the first main surface 1a of the transparent flexible substrate 1, overlapping in plan view a region including the plural electrodes 2. The electromagnetic shield 3 serves to reduce harmful noise that causes improper operations from a display device.

Since the transparent conductive film 50 of the electromagnetic shield 3 is made of the same material as the electrode 2, the material will not be described.

<First Electromagnetic Shield Wiring Line>

Furthermore, as illustrated in FIG. 1B, on the second main surface 1b of the transparent flexible substrate 1, the pair of first electromagnetic shield wiring lines 31 electrically connected to the electromagnetic shield 3 is formed, in the sensor unit 11, extending to the edge located adjacent to the tail portion 12.

As illustrated in FIG. 1B, each of the first electromagnetic shield wiring lines 31 is a laminated body in which the transparent conductive film 50 and the light-shielding metal film 60 are stacked in the mentioned order from the transparent flexible substrate 1. Since the transparent conductive film 50 and the light-shielding metal film 60 of the first electromagnetic shield wiring line 31 are made of the same materials as the laminated body of the first electrode wiring line 21, the materials will not be described.

<Electromagnetic Shield Mask>

Furthermore, as illustrated in FIG. 1B, the electromagnetic shield mask 33 including the light-shielding metal film is formed in the tail portion 12 on the second main surface 1b of the transparent flexible substrate 1 overlapping in plan view a region including the plural second electrode wiring lines 22.

In the present embodiment, the electromagnetic shield mask 33 is a laminated body in which the transparent conductive film 50 and the light-shielding metal film 60 are stacked in the mentioned order from the transparent flexible substrate 1, and the electromagnetic shield mask 33 is divided into portions in plan view. In addition, the transparent conductive film 50 and the light-shielding metal film 60 of the electromagnetic shield mask 33 are integrally formed with the first electromagnetic shield wiring lines 31. Since the electromagnetic shield mask 33 is made of the same material as the first electromagnetic shield wiring line 31, the material will not be described.

The electromagnetic shield mask 33 including the light-shielding metal film serves to prevent formation of a back-transfer pattern 90 of the plural second electrode wiring lines 22 during the manufacturing process of the capacitance switch 5.

More specifically, after the electromagnetic shield mask 33 including the light-shielding metal film is formed on the second main surface 1b of the transparent flexible substrate 1, a film formed of the third photoresist 80 including conductive particles for forming the pair of first electromagnetic shield wiring lines 31 described below is formed. Thus, as illustrated in FIGS. 16A and 16B, a light exposure 200 to be subsequently performed for forming the plural second electrode wiring lines 22 does not reach a portion of the film in which the electromagnetic shield mask 33 is present, and thus the back-transfer pattern 90 is not formed. As a result, breaking does not occur at the time of crimping, which leads to high electrical reliability. In the drawings, dark portions indicated by reference numeral 80a are cured portions.

<Second Electromagnetic Shield Wiring Line>

Further, as illustrated in FIG. 1B, on the second main surface 1b of the transparent flexible substrate 1, the pair of second electromagnetic shield wiring lines 32 electrically connected to the pair of first electromagnetic shield wiring lines 31 and formed of the third photoresist 80 including the conductive particles is formed in the tail portion 12 having strip-shape extending from the edge of the sensor unit 11.

The plural pairs of second electromagnetic shield wiring lines 32 configure wiring of the FPC portion, and are arranged in plan view outward of the region including the plural second electrode wiring lines 22.

In other words, the electromagnetic shield mask 33 is divided into portions so that the pair of second electromagnetic shield wiring lines 32 does not short out by overlapping with the electromagnetic shield mask 33.

Since the second electromagnetic shield wiring line 32 is made of the same material as the second electrode wiring line 22, the material will not be described.

(Method of Manufacturing Capacitance Switch)

A method of manufacturing the capacitance switch of the present disclosure will be described with reference to the drawings.

Figure 3:
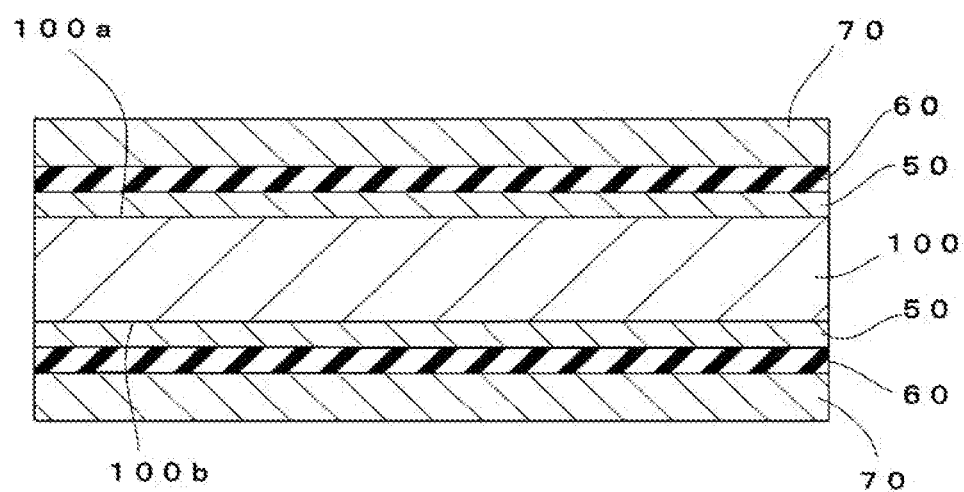
FIG. 3 is a partial enlarged cross-sectional view illustrating a manufacturing process of the capacitance switch according to the first embodiment of the present disclosure.

FIG. 3 is a partial enlarged cross-sectional view illustrating the manufacturing process of the capacitance switch according to the first embodiment. FIGS. 4A to 12B are schematic diagrams each illustrating the manufacturing process of the capacitance switch according to the first embodiment. In the drawings, FIG. A and FIG. B respectively illustrate a view seen from the first main surface 1a of the transparent flexible substrate 1 and a view seen from the second main surface 1b of the transparent flexible substrate 1. In addition, the reference signs surrounded by parentheses in the drawings indicate layers of the outermost surface uncovered in the schematic diagrams.

[1] First Layer-Stacking Process

First, a transparent flexible substrate raw material 100 having a size larger than that of the capacitance switch 5 is prepared. The transparent flexible substrate raw material 100 made of a resin film includes the sensor unit 11 and the tail portion 12 extending from the edge of the sensor unit 11.

The transparent conductive film 50, the light-shielding metal film 60, and the first photoresist 70 are stacked in the mentioned order on each of a first main surface 100a of the transparent flexible substrate raw material 100 and a second main surface 100b of the transparent flexible substrate raw material 100, which is an opposite surface opposite to the first main surface 100a (see FIG. 3, FIGS. 4A and 4B). The transparent conductive film 50, the light-shielding metal film 60, and the first photoresist 70 are formed entirely on the transparent flexible substrate raw material 100 in the layer-stacking process.

For the transparent flexible substrate raw material 100, the same material as the transparent flexible substrate 1 of the aforementioned capacitance switch 5 can be applied. Further, the aforementioned materials and forming methods are used for forming the transparent conductive film 50, the light-shielding metal film 60, and the first photoresist 70.

Note the transparent flexible substrate raw material 100 may be prepared in a sheet form or may be prepared in a wound state in a roll. In a case where the transparent flexible substrate raw material 100 is prepared in a wound state in a roll, the layer-stacking process and subsequent processes are continuously performed on the transparent flexible substrate raw material 100 that are fed unwinding from the roll, or are performed thereon while the transparent flexible substrate raw material 100 is being wound once or twice or more times in the middle of the processes.

[2] First Exposure/Development Process

Thereafter, as illustrated in FIGS. 5A and 5B, the first photoresist 70 on the first main surface 100a is partially exposed, developed, and patterned into the shape coinciding with the plural electrodes 2 and the plural first electrode wiring lines 21. In addition, the first photoresist 70 on the second main surface 100b is partially exposed, developed, and patterned into the shape coinciding with the aforementioned electromagnetic shield 3, the pair of first electromagnetic shield wiring lines 31, and the electromagnetic shield mask 33.

Exposure is a process of curing the exposed region of the first photoresist 70 and reducing solubility to a developer solution. An example of an exposure method may include digital exposure, analog exposure, or the like.

Development is a process of forming a pattern of a first photoresists 70 by curing the exposed region subsequently removing an uncured region with the use of the developer solution.

The developer solution is not particularly limited, and preferably, an example of the developer solution may include an aqueous solution of alkali metal hydroxide or alkaline-earth metal hydroxide, or an aqueous solution of carbonate, hydrogencarbonate, ammonia water, quaternary ammonium salt, or the like. The developer solution may be used in combination with a surfactant, an antifoam agent, an organic base, or the like. Furthermore, the developer solution may be a water-based developer solution in which water or an alkali solution and an organic solvent are mixed, or may be an organic solvent alone.

[3] First Etching Process

Figure 6A:
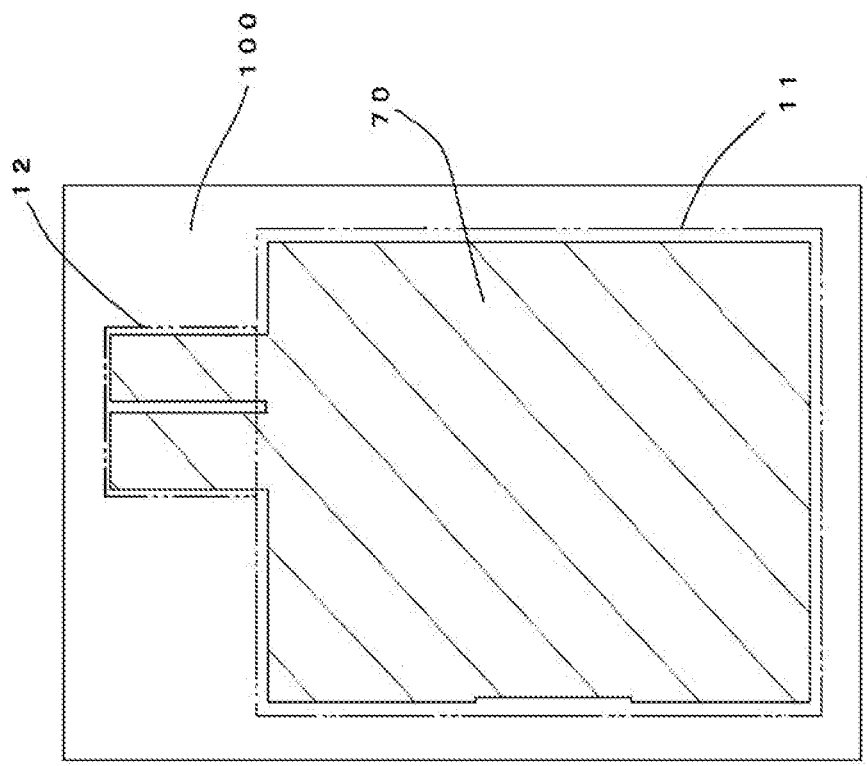
FIGS. 6A and 6B are schematic diagrams illustrating the manufacturing process of the capacitance switch according to the first embodiment of the present disclosure.
Figure 6B:
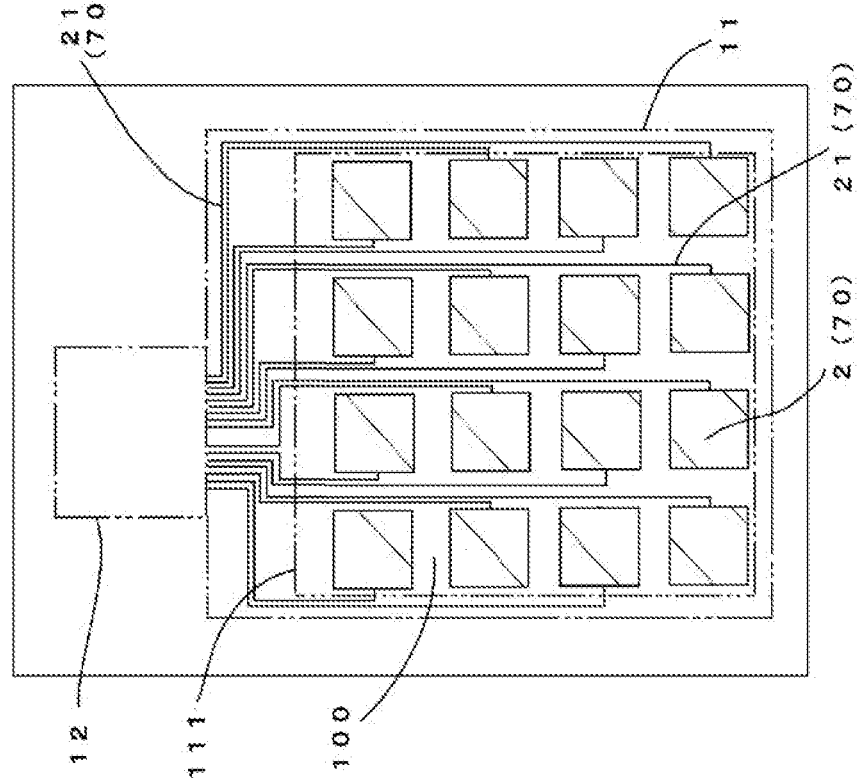

Next, as illustrated in FIGS. 6A and 6B, the uncovered transparent conductive film 50 and the light-shielding metal film 60 are etched.

As a result, the transparent conductive film 50 and the light-shielding metal film 60 on the both sides are patterned in the same pattern as the first photoresists 70 on the both sides. In particular, the pattern configuring the plural first electrode wiring lines 21 in the frame area 112 is formed by a photolithography approach and thus can be sufficiently and highly precisely formed as compared with a case where the first electrode wiring lines 21 are formed by screen printing of a silver paste.

Note that in the present embodiment, since the light-shielding metal film 60 is provided, the first photoresists 70 on the front and back sides can be simultaneously exposed, which leads to manufacturing with excellent productivity.

An etching solution with which both the transparent conductive film 50 and the light-shielding metal film 60 are etched is selected and used as appropriate from known etching solutions such as a ferric chloride solution. For example, when the transparent conductive film 50 and the light-shielding metal film 60 are an ITO film and a copper film, a ferric chloride solution can be used as the etching solution.

[4] First Resist Stripping Process

Next, as illustrated in FIGS. 7A and 7B, the first photoresists 70 on the both sides are stripped.

Thus, a portion of the light-shielding metal film 60, which is covered by the first photoresist 70 on each of the both sides is uncovered.

A stripping solution with which only the first photoresist 70 is stripped is selected and used as appropriate from known stripping solutions.

[5] Second Layer-Stacking Process

Figure 8A:
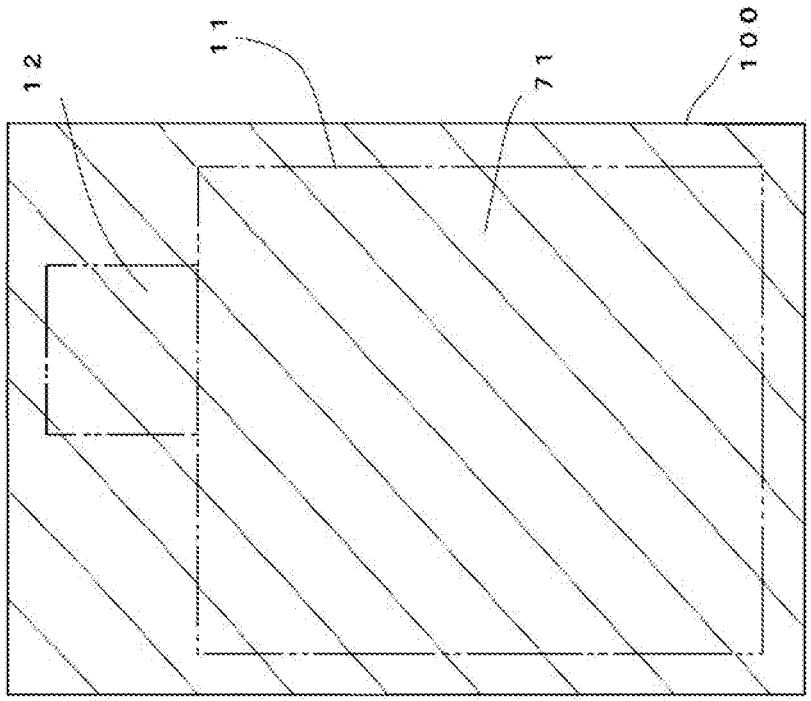
FIGS. 8A and 8B are schematic diagrams illustrating the manufacturing process of the capacitance switch according to the first embodiment of the present disclosure.
Figure 8B:
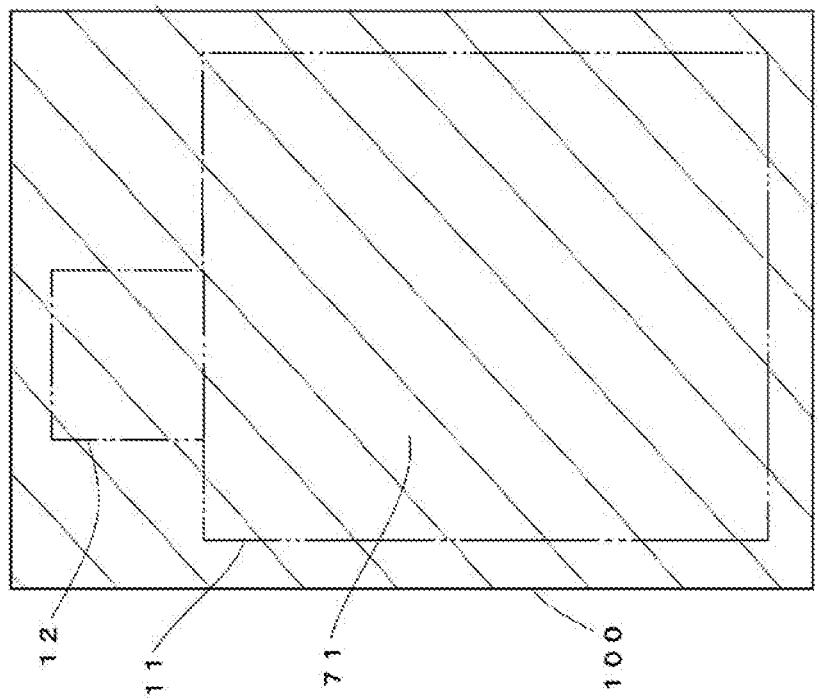

Next, as illustrated in FIGS. 8A and 8B, after stripping the first photoresist 70, a second photoresist 71 is formed on each of the first main surface 100*a* and the second main surface 100*b*.

The same material as the first photoresist 70 is applied to the second photoresist 71, and the second photoresist 71 is formed entirely on the transparent flexible substrate raw material 100.

[6] Second Exposure/Development Process

Thereafter, as illustrated in FIGS. 9A and 9B, the second photoresist 71 on the first main surface 100*a* is partially exposed and developed uncovering the light-shielding metal film 60 in the aforementioned view area 111. In addition, the second photoresist 71 on the second main surface 100*b* is partially exposed and developed uncovering the electromagnetic shield 3.

Note that in the present embodiment, since the light-shielding metal film 60 is provided, the second photoresists 71 on the front and back sides can be simultaneously exposed, which leads to manufacturing with excellent productivity.

The details of exposure and development of the second exposure/development process are similar to those of the first exposure/development process described above except for the pattern and thus will not be described.

[7] Second Etching Process

Next, as illustrated in FIGS. 10A and 10B, only the light-shielding metal film 60 that is uncovered is etched.

As a result, the view area 111 becomes the transparent conductive film 50. When a display device (not illustrated) is arranged behind the capacitance switch 5, a display screen can be transparently viewed.

An etching solution with which only the light-shielding metal film 60 is etched is selected and used as appropriate from known etching solutions such as hydrogen peroxide water under an acidic atmosphere. For example, when the transparent conductive film 50 and the light-shielding metal film 60 are an ITO film and a copper film, hydrogen peroxide water or the like under an acidic atmosphere can be used as the etching solution.

[8] Resist Stripping Process

Figures 11A, 11B:
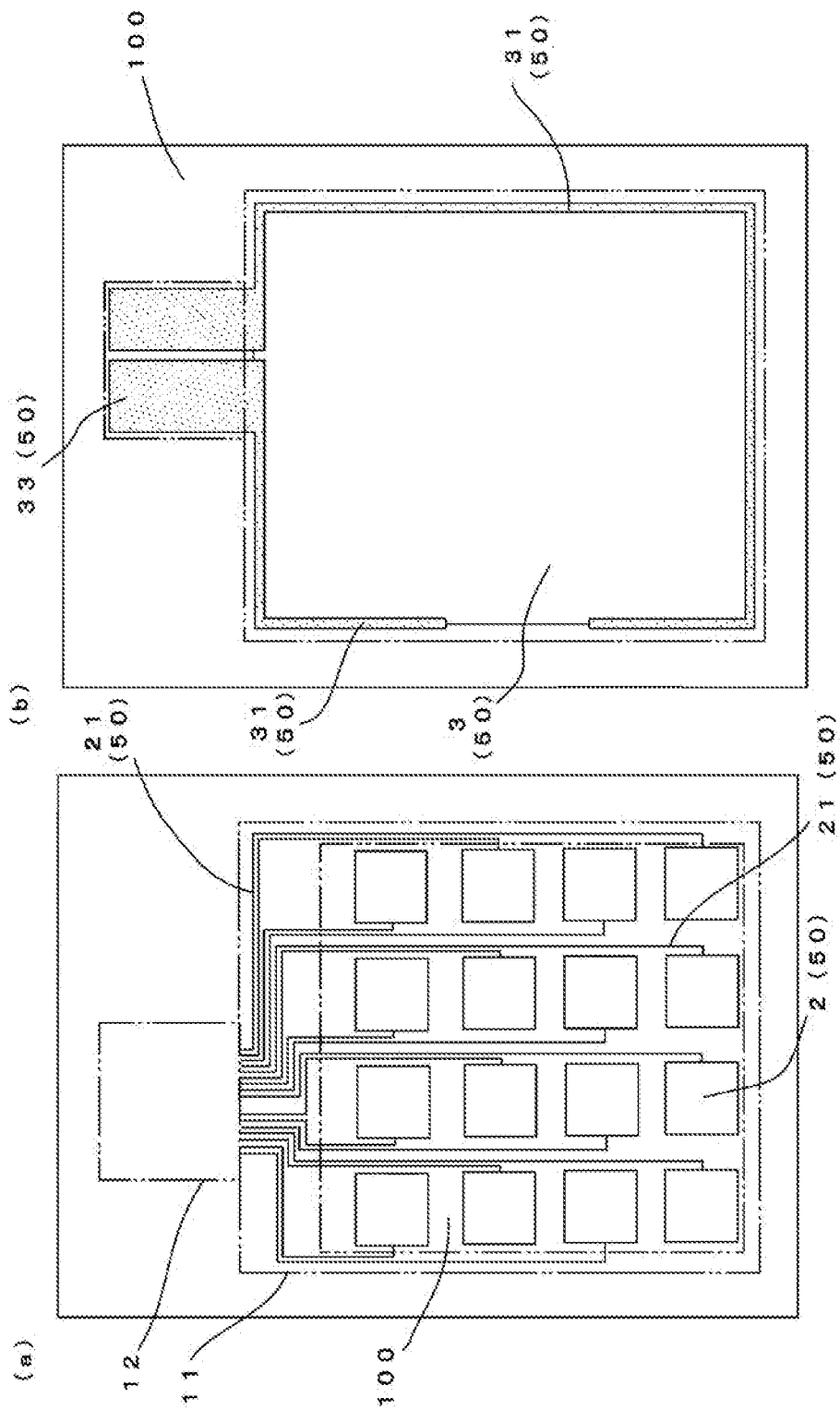
FIGS. 11A and 11B are schematic diagrams illustrating the manufacturing process of the capacitance switch according to the first embodiment of the present disclosure.

Next, as illustrated in FIGS. 11A and 11B, the second photoresist 71 is stripped after etching.

Thus, a portion of the light-shielding metal film 60, which is covered by the second photoresist 71 on each of the both sides is uncovered.

A stripping solution with which only the second photoresist 71 is stripped is selected and used as appropriate from known stripping solutions.

[9] Third Layer-Stacking Process

Next, as illustrated in FIGS. 12A and 12B, a third photoresist 80 including conductive particles is formed on each of the first main surface 100*a* from which the second photoresist 71 is stripped and the second main surface 100*b* from which the second photoresist 71 is stripped.

The same material and the same forming method of the aforementioned capacitance switch 5 are applied in forming the third photoresist 80.

[10] Third Exposure/Development Process

Thereafter, as illustrated in FIGS. 13A and 13B, the third photoresist 80 on the first main surface 100*a* is partially exposed, developed, and patterned into the shape of the plural second electrode wiring lines 22, and the third photoresist 80 on the second main surface 100*b* is partially exposed, developed, and patterned into the shape of the pair of second electromagnetic shield wiring lines 32.

Since the third photoresist 80 includes conductive particles in the third exposure/development process, the third photoresist 80 itself becomes a conductive pattern after being exposed and developed. The third exposure/development is different in this regard from the first and second exposure/development processes.

Figure 21:
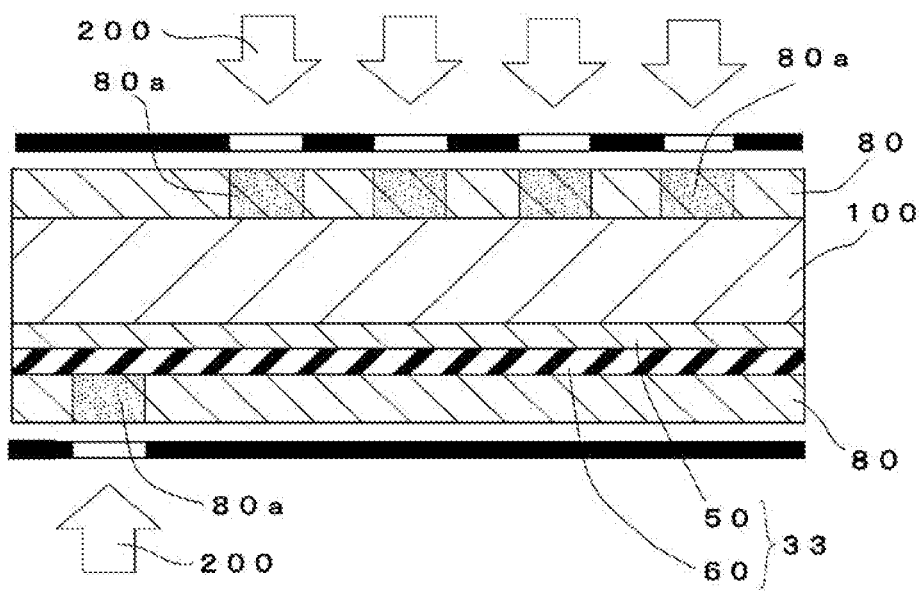
FIG. 21 is a partial enlarged cross-sectional view illustrating an exposure state in a case where an electromagnetic shield mask is present in a tail portion.
Figure 22:
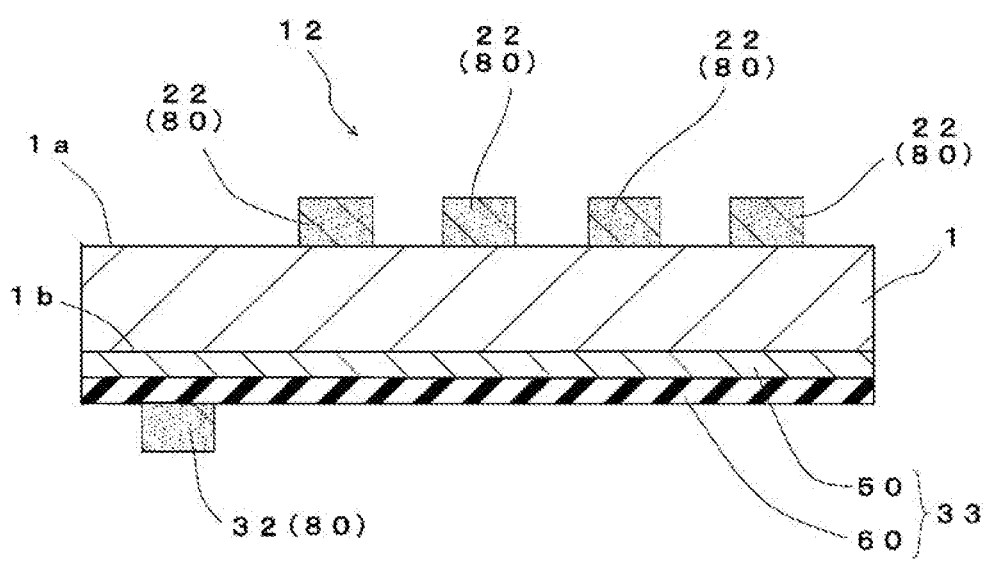
FIG. 22 is a partial enlarged cross-sectional view illustrating the tail portion of the FPC integrated capacitance switch obtained when no electromagnetic shield mask is present in the tail portion.

Moreover, as described above, the electromagnetic shield mask 33 including the light-shielding metal film is formed on the second main surface 1*b* of the transparent flexible substrate 1 and in the tail portion 12 overlapping in plan view the region including the plural second electrode wiring lines 22. Therefore, light exposure for forming the plural second electrode wiring lines 22 does not reach the third photoresist 80 on the second main surface 100*b*. Consequently, the back-transfer pattern 90 of the plural second electrode wiring lines 22 is not formed (see FIGS. 21 and 22). In the drawings, dark portions indicated by reference numeral 80*a* are cured portions.

Figure 23:
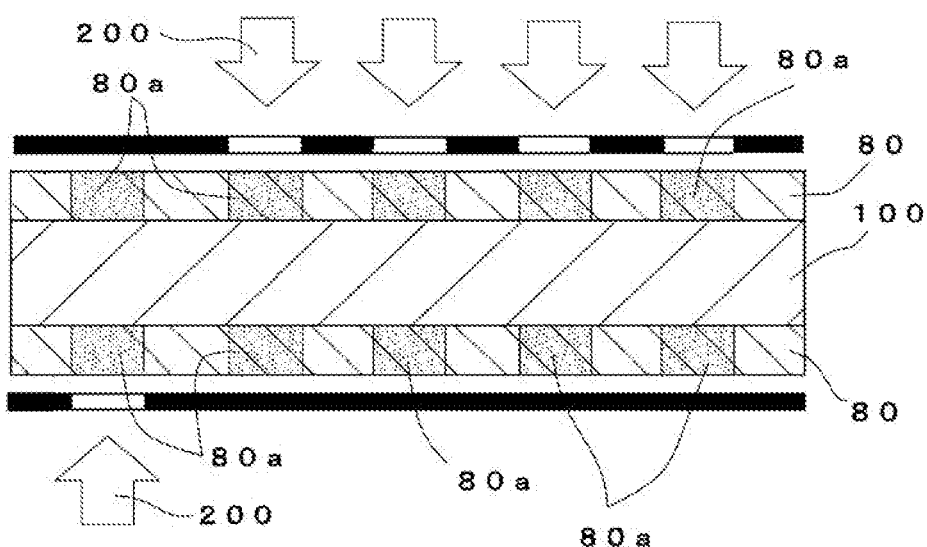
FIG. 23 is a partial enlarged schematic diagram illustrating an exposure state in a case where no electromagnetic shield mask is present in the tail portion.
Figure 24:
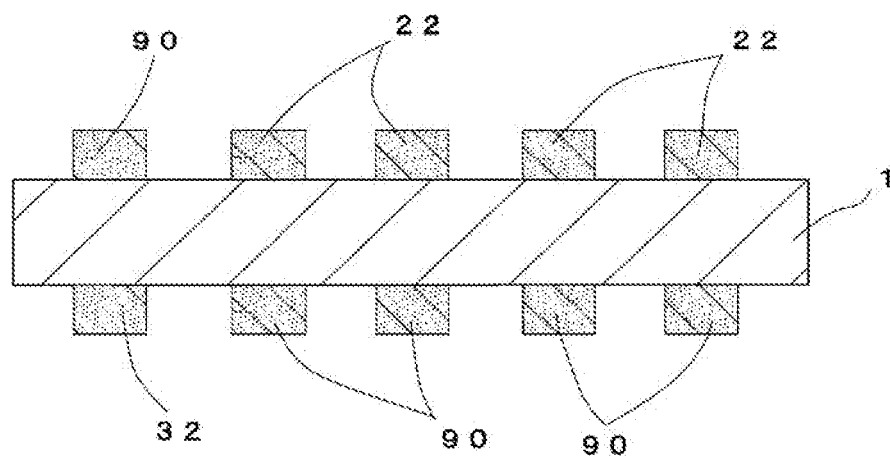
FIG. 24 is a partial enlarged cross-sectional view illustrating the tail portion of the FPC integrated capacitance switch obtained when no electromagnetic shield mask is present in the tail portion.

Note that when the electromagnetic shield mask 33 including the light-shielding metal film is not present in the tail portion 12, the light exposure 200 to the third photoresist 80 on one may reach the third photoresist 80 on the other as illustrated in FIG. 23 and thus extra cured portions are formed. When the photoresists are developed, back-transfer patterns 90 of the plural second electrode wiring lines 22 are formed as illustrated in FIG. 24.

The details of exposure and development of the third exposure/development process are similar to those of the first and second exposure/development processes described above except for the description above and thus will not be described.

[11] Punching Process

Finally, the transparent flexible substrate raw material 100 is punched into the shape of the transparent flexible substrate 1 including the sensor unit 11 and the tail portion 12, and thus the FPC integrated capacitance switch 5 illustrated in FIGS. 1A and 1B is obtained.

Known means can be used for punching the transparent flexible substrate raw material 100.

An example of a mechanical punching method may include punching with a Thomson blade and cylindrical cutting with a die cut roll. As example of an optical die cutting method may include a CO2 laser cutter.

The FPC integrated capacitance switch 5 obtained as described above includes the plural second electrode wiring lines 22 formed in the tail portion 12 and the pair of second electromagnetic shield wiring lines 32 formed in the tail portion 12, both of which are made of the third photoresist 80 including conductive particles. Therefore, wiring of the FPC portion does not break even when used in a bent manner, which leads to high electrical reliability. Further, a film made of the third photoresist 80 including conductive particles is exposed and developed, and thus the wiring pattern can be obtained. Therefore, the plural second electrode wiring lines 22 can be densely arranged.

Furthermore, after forming the electromagnetic shield mask 33 including the light-shielding metal film 60 on the second main surface 1b of the transparent flexible substrate 1, a film made of the third photoresist 80 including conductive particles for forming the pair of second electromagnetic shield wiring lines 32 is formed. Therefore, in a portion in which the electromagnetic shield mask 33 is present, the light exposure to be subsequently performed for forming the plural second electrode wiring lines 22 does not reach the third photoresist 80 on the second main surface 1b. Consequently, a back-transfer pattern is not formed. As a result, breaking does not occur even during crimping, which leads to high electrical reliability.

2. Second Embodiment

In the first embodiment, the FPC integrated capacitance switch 5 in which the electromagnetic shield mask 33 is electrically connected to the pair of first electromagnetic shield wiring lines 31 is described. However, the present disclosure is not limited to the first embodiment.

For example, as illustrated in FIGS. 14A and 14B, the electromagnetic shield mask 33 may be independent from the pair of first electromagnetic shield wiring lines 31.

In such a configuration, different materials can be advantageously applied to the pair of first electromagnetic shield wiring lines 31 and the electromagnetic shield mask 33.

Other points of the second embodiment are the same as the first embodiment and thus will not be described.

3. Third Embodiment

Further, the FPC integrated capacitance switch 5 in which the pair of second electromagnetic shield wiring lines 32 are separated and overlapped with the divided portions of the electromagnetic shield mask 33 on an opposite surface thereof to the transparent flexible substrate 1 is described in the first embodiment. However, the present disclosure is not limited to the first embodiment.

Figures 15A, 15B:
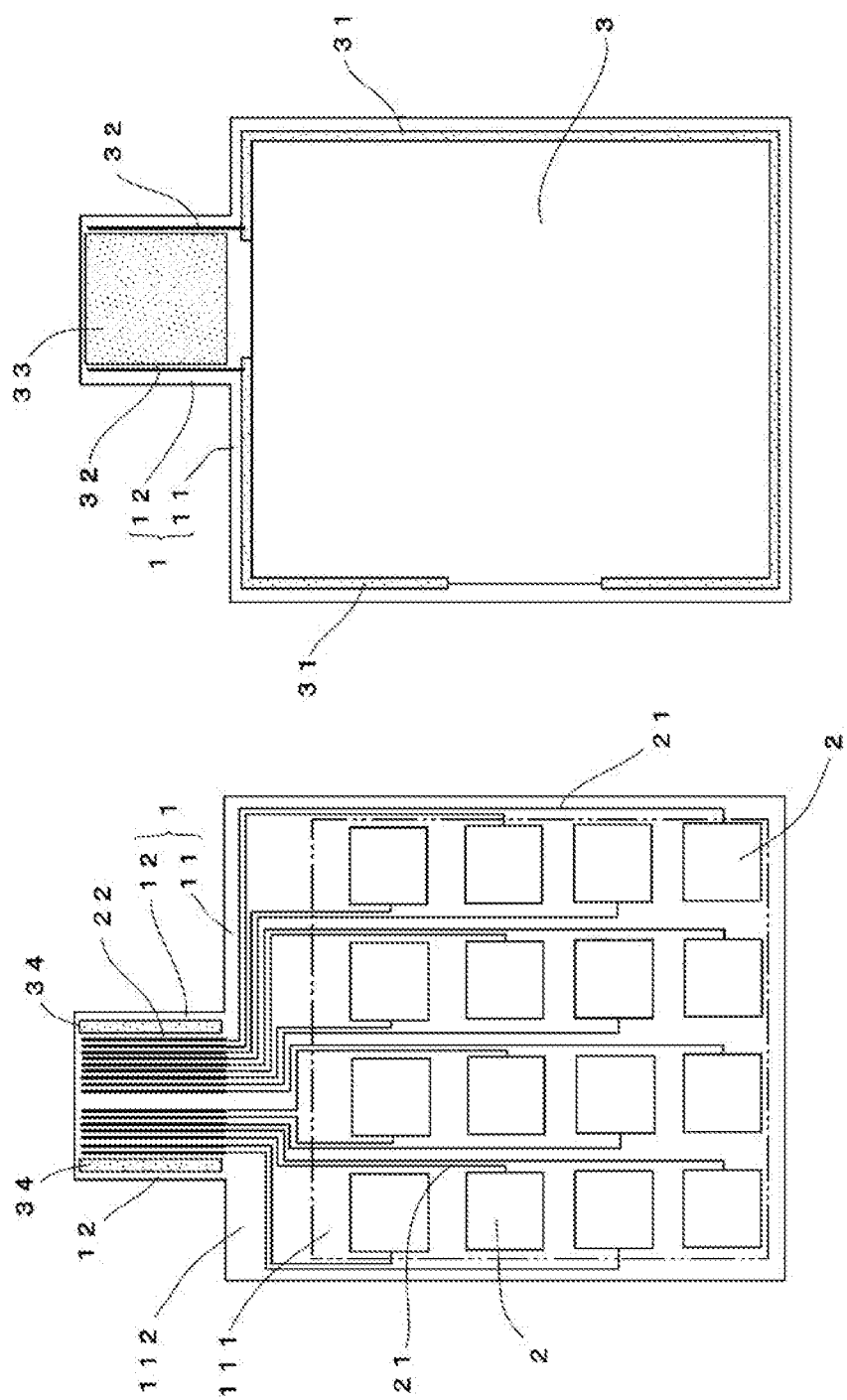
FIGS. 15A and 15B are schematic diagrams illustrating the FPC integrated capacitance switch according to a third embodiment of the present disclosure.

For example, as illustrated in FIGS. 15A and 15B, the pair of second electromagnetic shield wiring lines 32 may be formed in parallel and separated from each other at opposite sides of the electromagnetic shield mask 33 while not overlapping the electromagnetic shield mask 33.

In such a configuration, the pair of second electromagnetic shield wiring lines 32 may not short out even in a case where the electromagnetic shield mask 33 is not divided (see FIGS. 15A and 15B). Therefore, a pattern made of the third photoresist 80 is not formed in a gap between the divided portions of the electromagnetic shield mask 33. Consequently, waving at the time of crimping can be further surely prevented.

Moreover, the pair of second electromagnetic shield wiring lines 32 is not overlapped with the electromagnetic shield mask 33. Accordingly, even when cracking occurs in the electromagnetic shield mask 33, such cracking does not affect the second electromagnetic shield wiring lines 32.

In addition, in a case where the pair of second electromagnetic shield wiring lines 32 and the electromagnetic shield mask 33 are not overlapped with each other as in the third embodiment, a pair of electrode masks 34 including a light-shielding metal film is preferably provided on the first main surface 1a of the transparent flexible substrate 1 and is formed overlapping the pair of second electromagnetic shield wiring lines 32 in the tail portion 12 in plan view (see FIGS. 15A and 15B). The electrode mask 34 is formed to have the same width as the second electromagnetic shield wiring line 32 or a width greater than the second electromagnetic shield wiring line 32.

Figure 25:
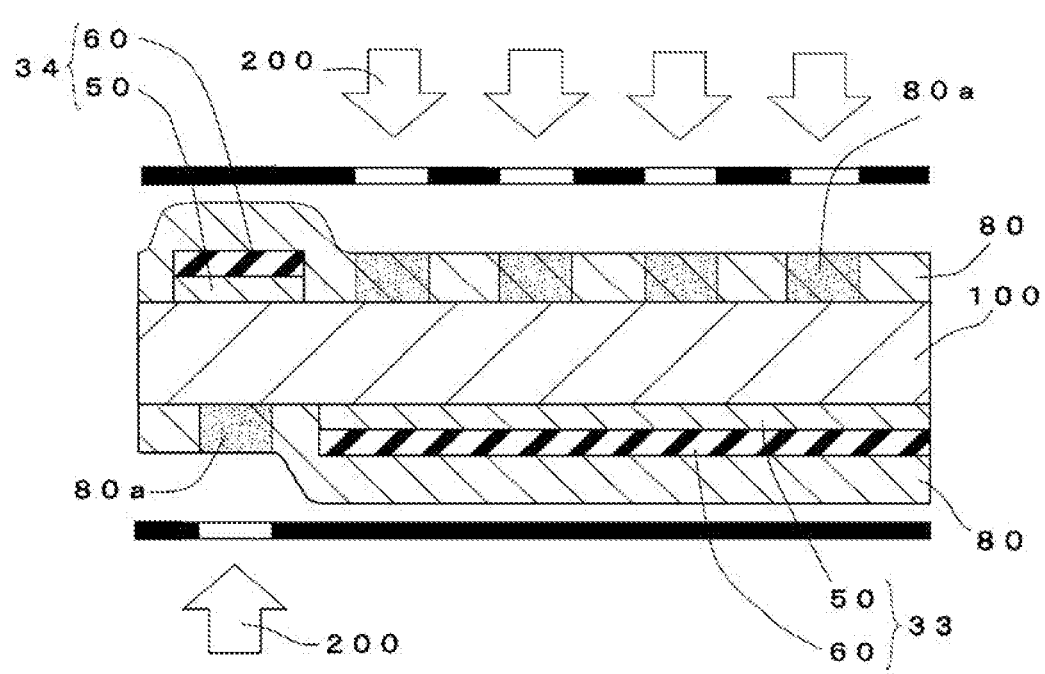
FIG. 25 is a partial enlarged cross-sectional view illustrating an exposure state in a case where electrode masks are present in the third embodiment of the present disclosure.

In such a configuration, a back-transfer pattern of the pair of second electromagnetic shield wiring lines 32 can be prevented from being formed on the first main surface 1a. Specifically, after forming the electrode masks 34 including the light-shielding metal film on the first main surface 1a of the transparent flexible substrate 1, a film made of a photoresist including conductive particles for forming the plural second electrode wiring lines 22 is formed. Accordingly, the light exposure to be subsequently performed for forming the pair of second electromagnetic shield wiring lines 32 does not reach a portion of the film in which the electrode masks 34 are present, and thus a back-transfer pattern is not formed (see FIG. 25).

Figure 26:
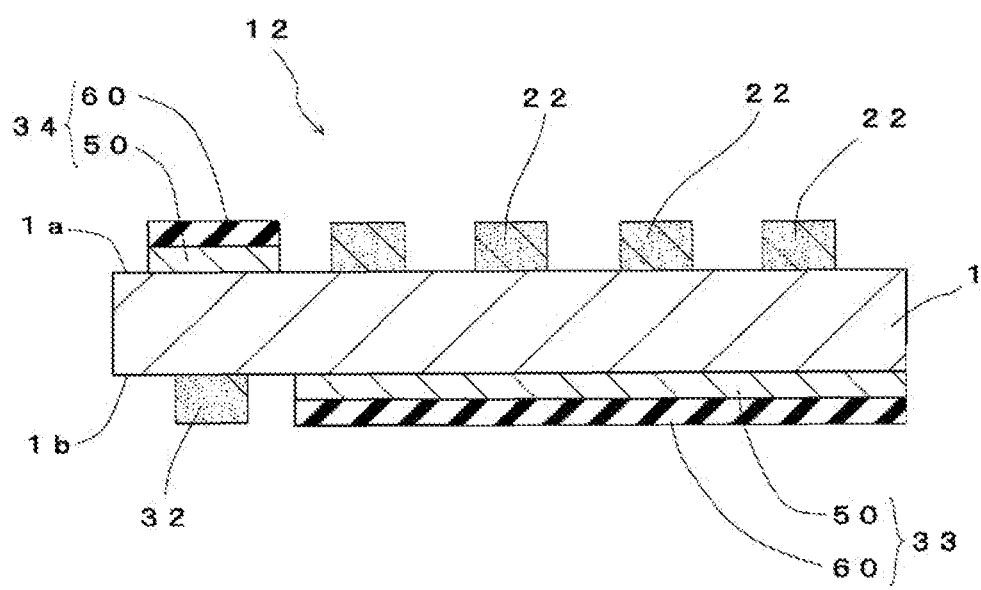
FIG. 26 is a partial enlarged cross-sectional view illustrating the tail portion of the FPC integrated capacitance switch obtained when the electrode masks are present in the third embodiment of the present disclosure.

As a result, a back-transfer patterns are not formed on any of the first main surface 1a and the second main surface 1b of the transparent flexible substrate 1, and thus in the regions where the plural second electrode wiring lines 22 and the pair of second electromagnetic shield wiring lines 32 are formed, the layered materials are the same and only the layer-stacking order is different (see FIG. 26). In other words, no difference occurs in thickness.

Figure 27:
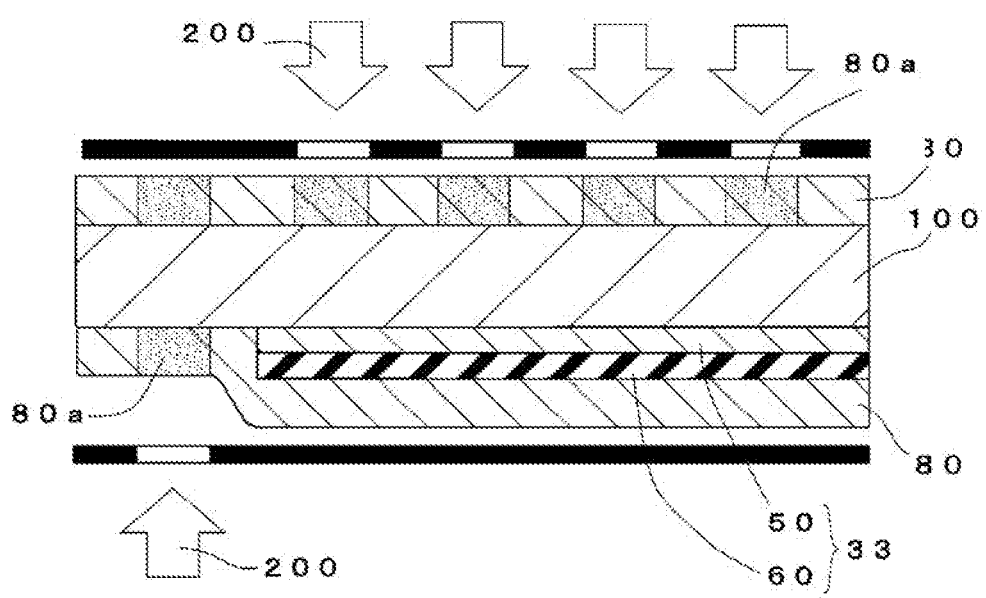
FIG. 27 is a partial enlarged schematic diagram illustrating an exposure state in a case where no electrode mask is present in the third embodiment of the present disclosure.
Figure 28:
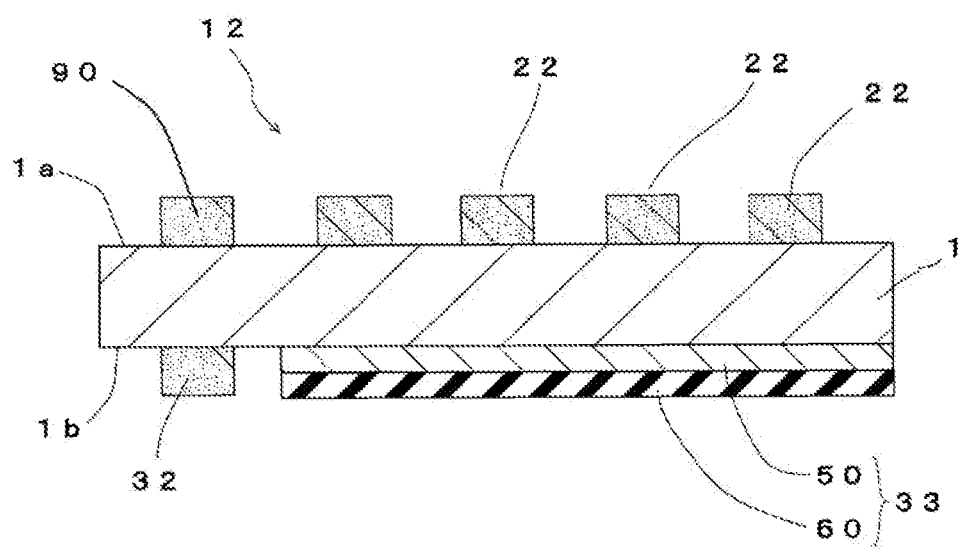
FIG. 28 is a partial enlarged cross-sectional view illustrating the tail portion of the FPC integrated capacitance switch obtained when no electrode mask is present in the third embodiment of the present disclosure.

When the thickness of opposite ends of the tail portion 12 between which the region (center portion) including the plural second electrode wiring lines 22 is interposed is increased by the back-transfer pattern 90 of the pair of second electromagnetic shield wiring lines 32 (see FIG. 27 and FIG. 28), the opposite ends have high rigidity, and thus the center portion is easily twisted (the electromagnetic shield mask 33 illustrated in FIG. 27 and FIG. 28 has the same thickness as the second electromagnetic shield wiring line 32 for easy understanding of the layer structure, but in fact, the value of the thickness of the second electromagnetic shield wiring line 32 is smaller than the value of the thickness of the electromagnetic shield mask 33 substantially by an order of magnitude). However, when the back-transfer pattern 90 of the pair of second electromagnetic shield wiring lines 32 is not formed as described above, the center portion is not twisted.

Other points of the third embodiment are the same as the first embodiment and thus will not be described.

(Method of Manufacturing Capacitance Switch)

A method of manufacturing the capacitance switch of the third embodiment will be described with reference to the drawings.

[1] First Layer-Stacking Process

The first layer-stacking process is the same as the first embodiment (see FIGS. 4A and 4B).

[2] First Exposure/Development Process

The first exposure/development process is modified such that in addition to patterning into the shape coinciding with the plural electrodes 2 and the plural first electrode wiring lines 21, patterning into the shape coinciding with the pair of electrode masks 34 is performed at the time of partially exposing and developing the first photoresist 70 on the first main surface 100*a* (see FIGS. 16A and 16B).

Other points are the same as the first embodiment.

[3] First Etching Process

Figure 17B:
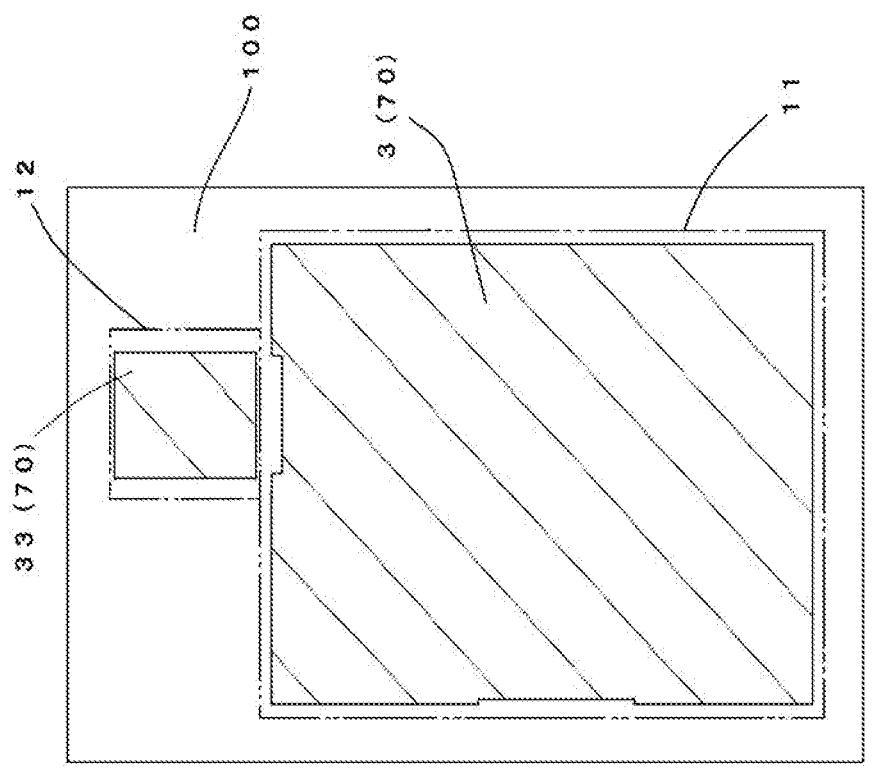
FIGS. 17A and 17B are schematic diagrams illustrating the manufacturing process of the capacitance switch according to the third embodiment of the present disclosure.
Figure 17A:
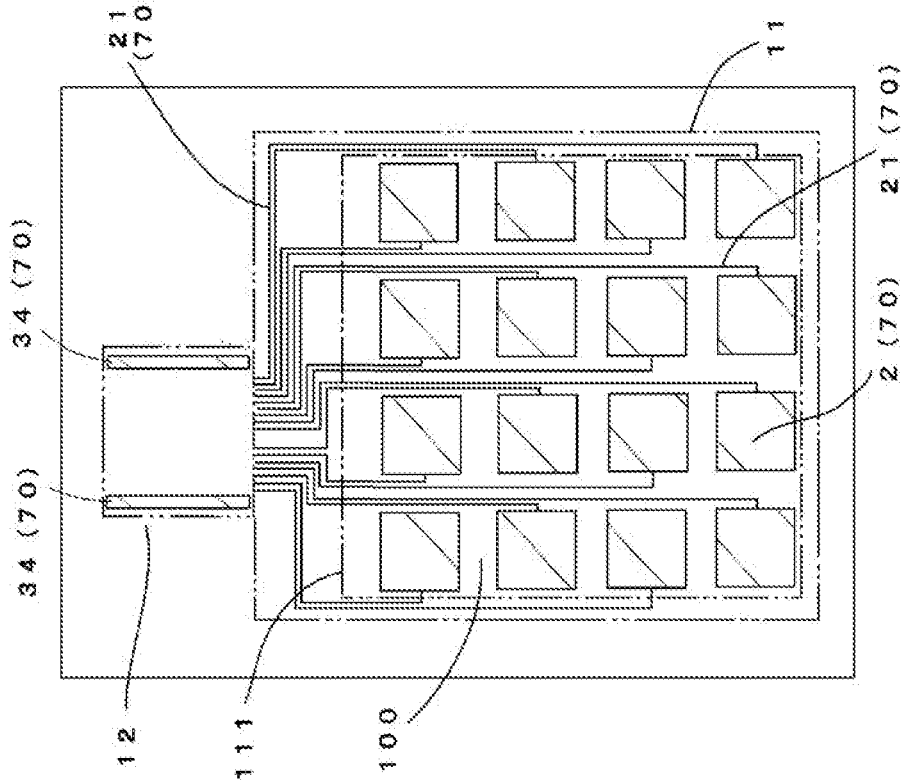

The first etching process is the same as the first embodiment except that the electrode masks 34 are formed based on the modification of the previous process (see FIGS. 17A and 17B).

[4] First Resist Stripping Process

Figures 18A, 18B:
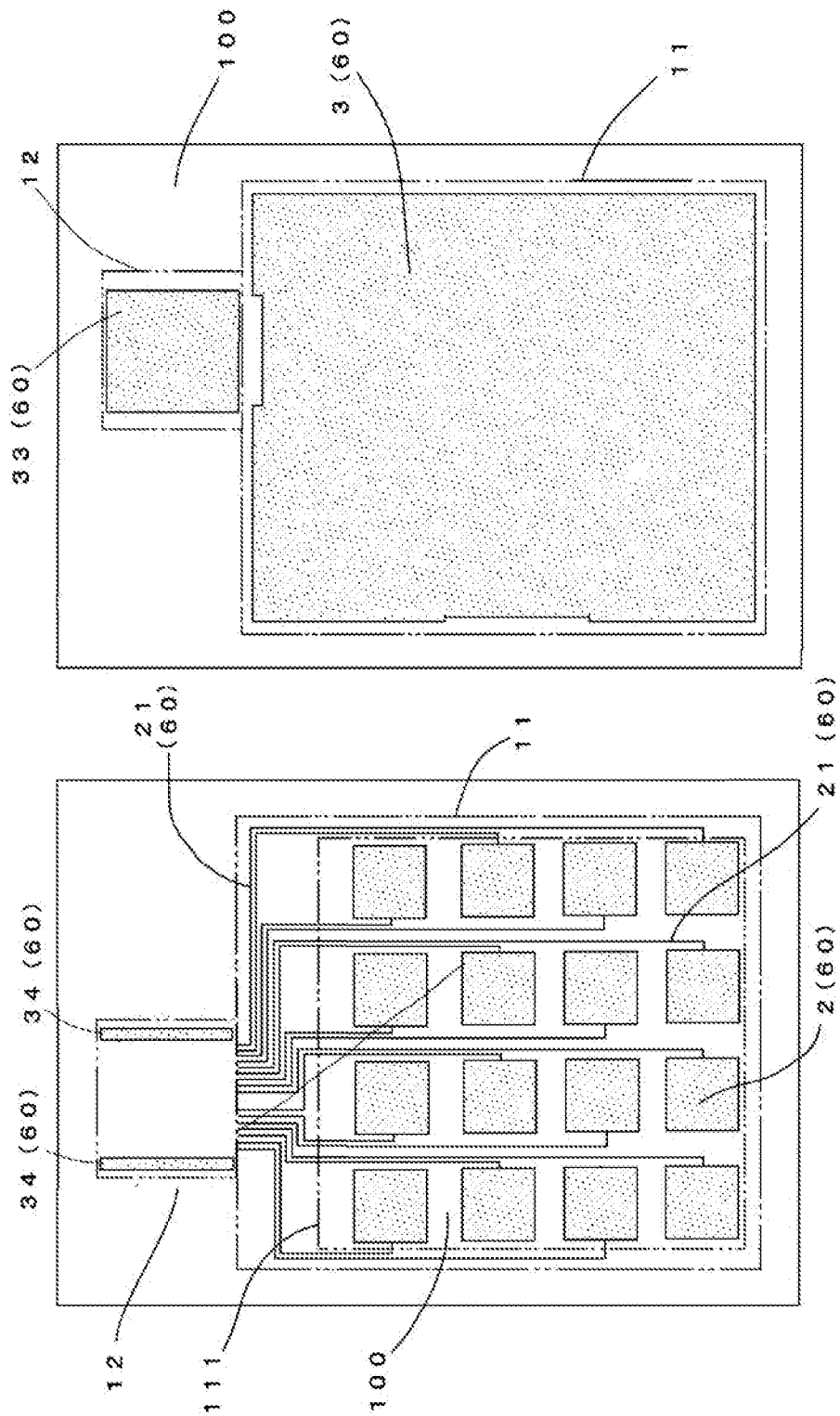
FIGS. 18A and 18B are schematic diagrams illustrating the manufacturing process of the capacitance switch according to the third embodiment of the present disclosure.

The first resist stripping process is the same as the first embodiment (see FIGS. 18A and 18B).

[5] Second Layer-Stacking Process

The second layer-stacking process is the same as the first embodiment (see FIGS. 8A and 8B).

[6] Second Exposure/Development Process

The second exposure/development process is the same as the first embodiment (see FIGS. 9A and 9B).

[7] Second Etching Process

The second etching process is the same as the first embodiment (see FIGS. 10A and 10B).

[8] Resist Stripping Process

The resist stripping process is the same as the first embodiment (see FIGS. 19A and 19B).

[9] Third Layer-Stacking Process

The third layer-stacking process is the same as the first embodiment (see FIGS. 12A and 12B).

[10] Third Exposure/Development Process

Figures 20A, 20B:
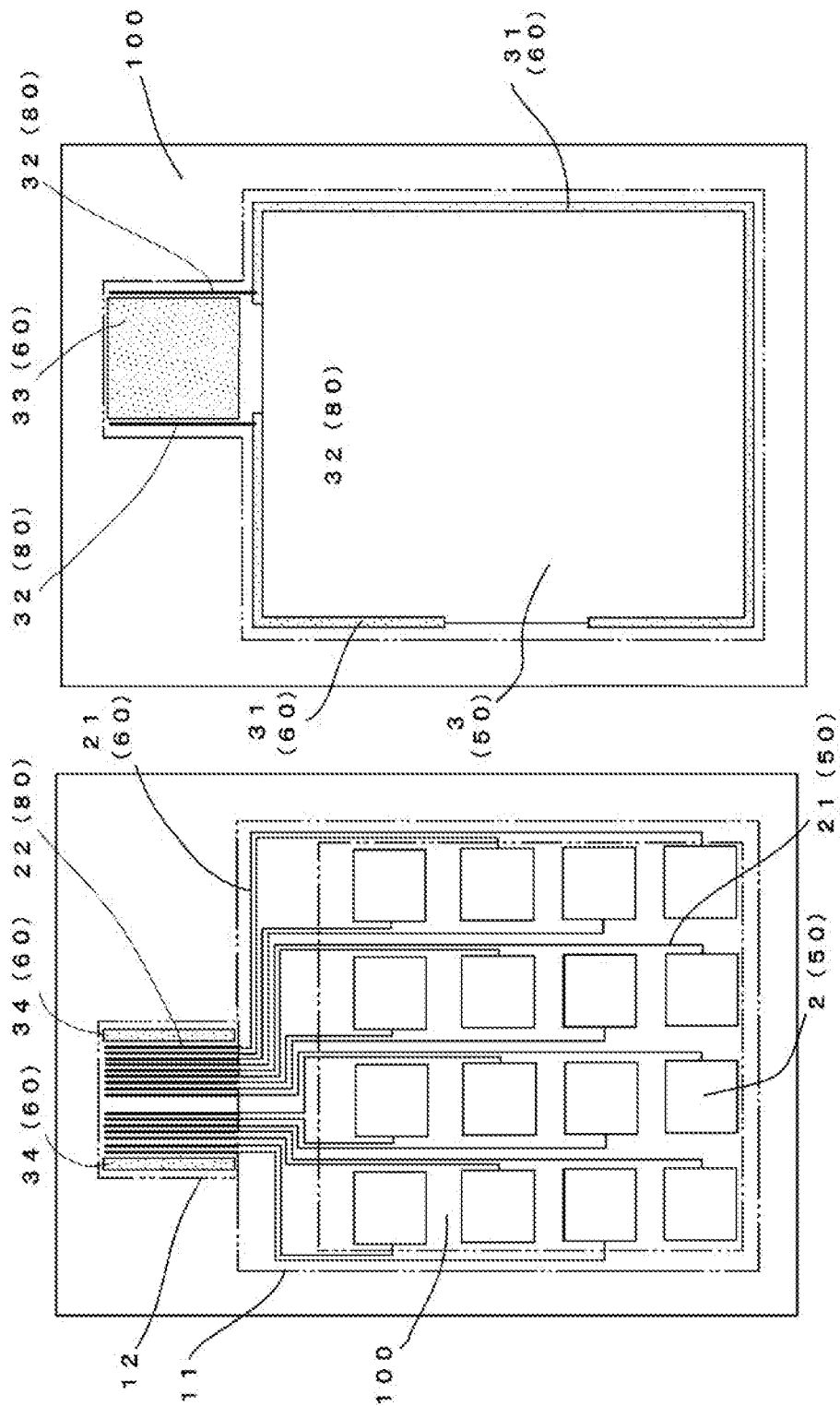
FIGS. 20A and 20B are schematic diagrams illustrating the manufacturing process of the capacitance switch according to the third embodiment of the present disclosure.

The third exposure/development process is the same as the first embodiment except that the light exposure for forming the pair of second electromagnetic shield wiring lines 32 does not reach a portion in which the electrode masks 34 are present and thus a back-transfer pattern is not formed (see FIGS. 20A and 20B).

[11] Punching Process

The punching process is the same as the first embodiment (see FIGS. 15A and 15B).

4. Other Embodiments

Although the plurality of embodiments of the present disclosure have been described as above, the present disclosure is not limited to the above-described embodiments, and various modifications are possible without departing from the gist of the disclosure. In particular, the plural embodiments and modified examples, which are described in the present specification, can be combined in any form as appropriate.

For example, the sensor unit 11 includes the view area 111, and the electrodes 2, the first electrode wiring lines 21, and the electromagnetic shield 3 are transparent on the view area 111 as described above. Alternatively, the electrodes 2, the first electrode wiring lines 21, and the electromagnetic shield 3 may be made of opaque materials without providing the view area 111.

INDUSTRIAL APPLICABILITY

The FPC integrated capacitance switch of the present disclosure can be preferably used as a capacitance switch mounted on a wristwatch, an in-vehicle equipment, and in addition, as a capacitance switch mounted on a portable small terminal, an electronic paper, a computer display, a small game machine, a display surface of a cash dispenser, a ticket vending machine, or the like.

REFERENCE SIGNS LIST

1: Transparent flexible substrate
1*a*, 100*a*: First main surface
1*b*, 100*b*: Second main surface
2: Electrode
3: Electromagnetic shield
11: Sensor unit
12: Tail portion
21: First electrode wiring line
22: Second electrode wiring line
31: First electromagnetic shield wiring line
32: Second electromagnetic shield wiring line
33: Electromagnetic shield mask
34: Electrode mask
50: Transparent conductive film
60: Light-shielding metal film
70: First photoresist
71: Second photoresist
80: Third photoresist (including conductive particles)
80*a*: Cured portion
90: Back-transfer pattern
111: View area
112: Frame area
100: Transparent flexible substrate raw material
200: Light exposure

The invention claimed is:

1. An FPC integrated capacitance switch, comprising:
    a transparent flexible substrate made of a resin film and including a sensor unit and a tail portion that extends from an edge of the sensor unit;
    a plurality of electrodes formed on a first main surface of the transparent flexible substrate and in the sensor unit;
    a plurality of first electrode wiring lines electrically connected to the plurality of electrodes and collectively formed to extend to the edge located adjacent to the tail portion;
    a plurality of second electrode wiring lines electrically connected to the plurality of first electrode wiring lines and formed in the tail portion to be arranged in parallel, the second electrode wiring lines being made of a photoresist including conductive particles;
    an electromagnetic shield formed, on a second main surface that is an opposite surface opposite to the first main surface of the transparent flexible substrate, overlapping in plan view a region including the plurality of electrodes;
    a pair of first electromagnetic shield wiring lines electrically connected to the electromagnetic shield and formed to extend to the edge located adjacent to the tail portion;
    a pair of second electromagnetic shield wiring lines electrically connected to the pair of first electromagnetic shield wiring lines and formed in the tail portion to be arranged in plan view outward of a region including the plurality of second electrode wiring lines, the second electromagnetic shield wiring lines being made of a photoresist including conductive particles; and
    an electromagnetic shield mask formed on the second main surface of the transparent flexible substrate and in the tail portion overlapping in plan view the region including the plurality of second electrode wiring lines, the electromagnetic shield mask including a light-shielding metal film.

2. The FPC integrated capacitance switch according to claim 1, wherein the electromagnetic shield mask is divided into portions, and the pair of second electromagnetic shield wiring lines is separated and overlapping a surface of the divided portions of the electromagnetic shield mask, the surface is opposite to the transparent flexible substrate.

3. The FPC integrated capacitance switch according to claim 2, wherein the electromagnetic shield mask is electrically connected to the pair of first electromagnetic shield wiring lines.

4. The FPC integrated capacitance switch according to claim 2, wherein the electromagnetic shield mask is independent from the pair of first electromagnetic shield wiring lines.

5. The FPC integrated capacitance switch according to claim 1, wherein
the pair of second electromagnetic shield wiring lines is not overlapped with the electromagnetic shield mask, and
a pair of electrode masks including a light-shielding metal film is further provided, the electrode masks being formed on the first main surface of the transparent flexible substrate and in the tail portion overlapping the pair of second electromagnetic shield wiring lines in plan view.

6. The FPC integrated capacitance switch according to claim 1, wherein the sensor unit includes a view area and a frame area surrounding the view area, and the electrodes, the first electrode wiring lines, and the electromagnetic shield are transparent on the view area.

7. The FPC integrated capacitance switch according to claim 1, wherein the conductive particles included in the second electrode wiring lines and the second electromagnetic shield wiring lines are any one of metallic powder, a particle formed by coating a surface of a core element with a conductive layer, carbon, and graphite.

8. The FPC integrated capacitance switch according to claim 1, wherein the light-shielding metal film of the electromagnetic shield mask is made any one of copper, silver, tin, aluminum, and nickel.

9. A method of manufacturing the FPC integrated capacitance switch according to claim 1, comprising:
[1] a process of using a transparent flexible substrate raw material, made of resin film, includes, in a plane, a sensor unit and a tail portion extending from an edge of the sensor unit, and stacking a transparent conductive film, a light-shielding metal film, and a first photoresist in layers in the mentioned order on each of a first main surface of the transparent flexible substrate raw material and a second main surface which is an opposite surface of the first main surface;
[2] a process of partially exposing, developing the first photoresist on the first main surface and patterning the first photoresist into the shape coinciding with the plurality of electrodes and the plurality of first electrode wiring lines, and partially exposing, developing the first photoresist on the second main surface and patterning the first photoresist into the shape coinciding with the electromagnetic shield, the pair of first electromagnetic shield wiring lines, and the electromagnetic shield mask;
[3] a process of etching the transparent conductive film that is uncovered and the light-shielding metal film;
[4] a process of stripping the first photoresist after etching;
[5] a process of forming a second photoresist on each of the first main surface from which the first photoresist is stripped and the second main surface from which the first photoresist is stripped;
[6] a process of partially exposing, developing the second photoresist on the first main surface and uncovering the light-shielding metal film in a view area, and partially exposing, developing the second photoresist on the second main surface and uncovering the electromagnetic shield;
[7] a process of etching only the light-shielding metal film that is uncovered;
[8] a process of stripping the second photoresist after etching;
[9] a process of forming, on each of the first main surface from which the second photoresist is stripped and the second main surface from which the second photoresist is stripped, a third photoresist including conductive particles;
[10] a process of partially exposing, developing the third photoresist on the first main surface and patterning the third photoresist into the shape of the plurality of second electrode wiring lines, and partially exposing, developing the third photoresist on the second main surface and patterning the third photoresist into the shape of the pair of second electromagnetic shield wiring lines; and
[11] a process of finally punching the transparent flexible substrate raw material into the shape of a transparent flexible substrate including the sensor unit and the tail portion.

10. A method of manufacturing the FPC integrated capacitance switch according to claim 5, comprising:
[1] a process of using a transparent flexible substrate raw material, made of resin film, includes, in a plane, a sensor unit and a tail portion extending from an edge of the sensor unit, and stacking a transparent conductive film, a light-shielding metal film, and a first photoresist in layers in the mentioned order on each of a first main surface of the transparent flexible substrate raw material and a second main surface which is an opposite surface of the first main surface;
[2] a process of partially exposing, developing the first photoresist on the first main surface and patterning the first photoresist into the shape coinciding with the plurality of electrodes, the plurality of first electrode wiring lines, and the pair of electrode masks, and partially exposing, developing the first photoresist on the second main surface and patterning the first photoresist into the shape coinciding with the electromagnetic shield, the pair of first electromagnetic shield wiring lines, and the electromagnetic shield mask;
[3] a process of etching the transparent conductive film that is uncovered and the light-shielding metal film;
[4] a process of stripping the first photoresist after etching;
[5] a process of forming a second photoresist on each of the first main surface from which the first photoresist is stripped and the second main surface from which the first photoresist is stripped;
[6] a process of partially exposing, developing the second photoresist on the first main surface and uncovering the light-shielding metal film in a view area, and partially exposing, developing the second photoresist on the second main surface and uncovering the electromagnetic shield;
[7] a process of etching only the light-shielding metal film that is uncovered;
[8] a process of stripping the second photoresist after etching;

[9] a process of forming, on each of the first main surface from which the second photoresist is stripped and the second main surface from which the second photoresist is stripped, a third photoresist including conductive particles;
[10] a process of partially exposing, developing the third photoresist on the first main surface patterning the third photoresist into the shape of the plurality of second electrode wiring lines, and partially exposing, developing the third photoresist on the second main surface and patterning the third photoresist into the shape of the pair of second electromagnetic shield wiring lines; and
[11] a process of finally punching the transparent flexible substrate raw material into the shape of a transparent flexible substrate including the sensor unit and the tail portion.

\* \* \* \* \*